(12) United States Patent
Treves et al.

(10) Patent No.: US 8,402,638 B1
(45) Date of Patent: Mar. 26, 2013

(54) PRESS SYSTEM WITH EMBOSSING FOIL FREE TO EXPAND FOR NANO-IMPRINTING OF RECORDING MEDIA

(75) Inventors: David Treves, Palo Alto, CA (US); Paul C. Dorsey, Sunnyvale, CA (US)

(73) Assignee: WD Media, Inc., San Jose, CA (US)

( * ) Notice: Subject to any disclaimer, the term of this patent is extended or adjusted under 35 U.S.C. 154(b) by 426 days.

(21) Appl. No.: 12/614,334

(22) Filed: Nov. 6, 2009

(51) Int. Cl.
*B23P 19/00* (2006.01)
*G11C 5/12* (2006.01)
*H01M 10/14* (2006.01)

(52) U.S. Cl. ......... 29/737; 29/603.03; 29/727; 425/138; 425/150; 425/193; 425/400; 425/406

(58) Field of Classification Search ............ 29/727, 29/737; 425/138, 150, 193, 400, 406, 451.6, 425/808, 810
See application file for complete search history.

(56) References Cited

U.S. PATENT DOCUMENTS

| | | |
|---|---|---|
| 3,946,634 A | 3/1976 | Allen et al. |
| 4,062,600 A | 12/1977 | Wyse |
| 4,343,025 A | 8/1982 | Kronfeld et al. |
| 4,571,320 A | 2/1986 | Walker |
| 4,583,144 A * | 4/1986 | Kato .................. 360/133 |
| 4,694,703 A | 9/1987 | Routson |
| 4,770,739 A | 9/1988 | Orvek et al. |
| 4,778,372 A | 10/1988 | Mutti et al. |
| 4,786,564 A | 11/1988 | Chen et al. |
| 4,931,351 A | 6/1990 | McColgin et al. |
| 5,018,037 A | 5/1991 | Krounbi et al. |
| 5,045,150 A | 9/1991 | Cleeves et al. |
| 5,045,165 A | 9/1991 | Yamashita |
| 5,077,888 A | 1/1992 | Tokisue et al. |
| 5,080,549 A | 1/1992 | Goodwin et al. |
| 5,091,047 A | 2/1992 | Cleeves et al. |
| 5,219,788 A | 6/1993 | Abernathey et al. |
| 5,259,926 A | 11/1993 | Kuwabara et al. |
| 5,290,397 A | 3/1994 | Ober et al. |
| 5,293,287 A | 3/1994 | Tzur et al. |
| 5,295,802 A | 3/1994 | Hersbt |
| 5,318,877 A | 6/1994 | Ober et al. |
| 5,320,934 A | 6/1994 | Misium et al. |
| 5,322,987 A | 6/1994 | Thomas et al. |
| 5,413,018 A | 5/1995 | Wada et al. |

(Continued)

FOREIGN PATENT DOCUMENTS

| | | |
|---|---|---|
| GB | 2444627 | 6/2008 |
| JP | 04209376 A * | 7/1992 |

(Continued)

OTHER PUBLICATIONS

U.S. Appl. No. 12/614,367, filed Nov. 6, 2009, 57 pages.

(Continued)

*Primary Examiner* — Paul D Kim

(57) ABSTRACT

Recording media press systems and methods of operating such press systems. Press system embodiments include a first die and a second die. The press system further includes a mandrel extending along a longitudinal mandrel axis through the first die. A rod portion of the mandrel to receive a magnetic recording disk to be pressed. The press system further includes a foil holder coupled to the first die. The foil holder to clamp a first portion of an embossing foil to the first die and allow the clamped foil portion to move in a radial direction relative to the foil holder.

15 Claims, 27 Drawing Sheets

U.S. PATENT DOCUMENTS

| | | |
|---|---|---|
| 5,427,599 A | 6/1995 | Greschner et al. |
| 5,455,145 A | 10/1995 | Tarumoto |
| 5,493,959 A | 2/1996 | Yagi et al. |
| 5,512,131 A | 4/1996 | Kumar et al. |
| 5,537,282 A | 7/1996 | Treves et al. |
| 5,571,473 A | 11/1996 | Fujii |
| 5,681,638 A | 10/1997 | Korenaga |
| 5,738,008 A | 4/1998 | Freund |
| 5,772,905 A | 6/1998 | Chou |
| 5,820,769 A | 10/1998 | Chou |
| 5,888,433 A | 3/1999 | Amo |
| 5,894,056 A | 4/1999 | Kakizaki et al. |
| 5,915,915 A | 6/1999 | Allen et al. |
| 5,956,216 A | 9/1999 | Chou |
| 5,985,524 A | 11/1999 | Allen et al. |
| 6,019,930 A | 2/2000 | Baresich |
| 6,086,730 A | 7/2000 | Liu et al. |
| 6,150,015 A | 11/2000 | Bertero et al. |
| 6,210,855 B1 | 4/2001 | Ueda et al. |
| 6,218,056 B1 | 4/2001 | Pinarbasi et al. |
| 6,242,718 B1 | 6/2001 | Ferro et al. |
| 6,257,866 B1 | 7/2001 | Fritz et al. |
| 6,276,656 B1 | 8/2001 | Baresich |
| 6,281,679 B1 | 8/2001 | King et al. |
| 6,309,580 B1 | 10/2001 | Chou |
| RE37,470 E | 12/2001 | Ohkura et al. |
| 6,381,090 B1 | 4/2002 | Suzuki et al. |
| 6,383,944 B1 | 5/2002 | Furihata et al. |
| 6,440,646 B2 | 8/2002 | Ueda et al. |
| 6,482,279 B2 | 11/2002 | Nakano et al. |
| 6,482,742 B1 | 11/2002 | Chou |
| 6,518,189 B1 | 2/2003 | Chou |
| 6,520,764 B1 | 2/2003 | Ito et al. |
| 6,696,220 B2 | 2/2004 | Bailey et al. |
| 6,705,853 B1 | 3/2004 | Nehring |
| 6,757,116 B1 | 6/2004 | Curtiss et al. |
| 6,793,476 B2 | 9/2004 | Bryja et al. |
| 6,869,557 B1 | 3/2005 | Wago et al. |
| 6,939,120 B1 | 9/2005 | Harper |
| 6,951,173 B1 | 10/2005 | Meissl et al. |
| 6,989,114 B1 | 1/2006 | Korenaga et al. |
| 6,994,541 B2 | 2/2006 | Chung et al. |
| 7,044,726 B2 | 5/2006 | Koyama et al. |
| 7,082,876 B2 | 8/2006 | Olsson |
| 7,144,539 B2 | 12/2006 | Olsson |
| 7,162,810 B2 | 1/2007 | Biggs et al. |
| 7,186,109 B2 | 3/2007 | Koyama et al. |
| 7,204,686 B2 | 4/2007 | Chung et al. |
| 7,229,266 B2 | 6/2007 | Harper |
| 7,252,492 B2 | 8/2007 | Olsson et al. |
| 7,281,920 B2 | 10/2007 | Homola et al. |
| 7,322,287 B2 | 1/2008 | Tan et al. |
| 7,329,114 B2 | 2/2008 | Harper et al. |
| 7,363,854 B2 | 4/2008 | Sewell |
| 7,686,606 B2 | 3/2010 | Harper et al. |
| 8,100,685 B1 | 1/2012 | Harper et al. |
| 2002/0025408 A1 | 2/2002 | Davis |
| 2002/0042027 A1 | 4/2002 | Chou et al. |
| 2002/0071214 A1 | 6/2002 | Belser |
| 2002/0098426 A1 | 7/2002 | Sreenivasan et al. |
| 2002/0132482 A1 | 9/2002 | Chou |
| 2002/0135939 A1 | 9/2002 | Wada |
| 2002/0136927 A1 | 9/2002 | Hieda et al. |
| 2002/0167117 A1 | 11/2002 | Chou |
| 2002/0177319 A1 | 11/2002 | Chou |
| 2003/0030188 A1 | 2/2003 | Spengler |
| 2003/0034329 A1 | 2/2003 | Chou |
| 2003/0071016 A1 | 4/2003 | Shih et al. |
| 2003/0080471 A1 | 5/2003 | Chou |
| 2003/0080472 A1 | 5/2003 | Chou |
| 2003/0170995 A1 | 9/2003 | Chou |
| 2003/0170996 A1 | 9/2003 | Chou |
| 2004/0053146 A1 | 3/2004 | Sreenivasan et al. |
| 2004/0132301 A1 | 7/2004 | Harper et al. |
| 2004/0238972 A1 | 12/2004 | Ho et al. |
| 2005/0146078 A1 | 7/2005 | Chou et al. |
| 2005/0150862 A1 | 7/2005 | Harper et al. |
| 2005/0151300 A1 | 7/2005 | Harper et al. |
| 2005/0155554 A1 | 7/2005 | Saito |
| 2005/0156342 A1 | 7/2005 | Harper et al. |
| 2005/0158163 A1 | 7/2005 | Harper et al. |
| 2005/0172848 A1 | 8/2005 | Olsson |
| 2005/0236738 A1 | 10/2005 | Harper |
| 2007/0062396 A1 | 3/2007 | Takai et al. |
| 2007/0134362 A1 | 6/2007 | Heidari |
| 2007/0166651 A1 | 7/2007 | Fujita et al. |
| 2007/0211592 A1 | 9/2007 | Sakurai et al. |
| 2008/0093760 A1 | 4/2008 | Harper et al. |
| 2008/0223237 A1 | 9/2008 | Ando et al. |
| 2008/0241307 A1* | 10/2008 | Kishi et al. ............ 425/385 |

FOREIGN PATENT DOCUMENTS

| | | |
|---|---|---|
| JP | 07-186194 A1 | 7/1995 |
| JP | 08-124223 A1 | 5/1996 |
| JP | 2003-291178 A1 | 10/2003 |
| WO | 9801890 | 1/1998 |
| WO | 0048172 | 8/2000 |
| WO | 0050321 | 8/2000 |
| WO | 0142858 | 6/2001 |

OTHER PUBLICATIONS

U.S. Appl. No. 12/614,355, filed Nov. 6, 2009, 57 pages.
U.S. Appl. No. 12/614,343, filed Nov. 6, 2009, 57 pages.
Brian Faircloth et al., "Bilayer, Nanoimprint Lithography", J. Vac. Sci. Technol.B 18(4), Jul./Aug. 2000, 2000 American Vacuum Society, pp. 1-8.
Matsui, S. et al., "Room Temperature Replication in Spin on Glass by Nanoimprint Technology", J. Vac. Sol. Technol. B, vol. 19, No. 6, Nov./Dec. 2001, pp. 2801-2805.
Wu et al., "Large Area High Density Quantized Magnetic Disks Fabricated Using Nanoimprint Lithography", J. Vac. Sci. Technol. B vol. 16, No. 6, Nov./Dec. 1998, pp. 3825-3829.
Office Action dated Apr. 11, 2012 from U.S. Appl. No. 12/614,367, 16 pages.
Office Action dated Jul. 26, 2012 from U.S. Appl. No. 12/614,367, 16 pages.

* cited by examiner

PRESS SYSTEM WITH EMBOSSING FOIL FREE TO EXPAND FOR NANO-IMPRINTING OF RECORDING MEDIA

TECHNICAL FIELD

This invention relates to the field of manufacturing, and more specifically, to a press system for nano-imprinting of recording media.

BACKGROUND

A disk drive system typically has one or more magnetic recording media (a.k.a., disks) and control mechanisms for storing data within approximately circular tracks on the disk. The magnetic recording media is composed of a substrate and one or more layers deposited on the substrate. A substrate may be produced from a blank sheet of, for example, metal-based material such as aluminum or aluminum magnesium. The sheet may be punched to generate a disk-shaped substrate having an inner diameter (ID) and an outer diameter (OD). The disk-shaped substrate may be further processed (e.g., polished, textured, layer deposition, etc.) to produce the magnetic recording disk.

Advancing the art of magnetic hard disk drives involves increasing the recording density of a disk drive system. Recording density is a measure of the amount of data that may be stored in a given area of disk. One method for increasing recording densities is to pattern the surface of the disk to form discrete tracks, referred to as discrete track recording (DTR). The recessed zones separate the raised zones to inhibit or prevent the unintended storage of data in the raised zones.

One method of producing DTR magnetic recording media includes using a press to imprint embossable films residing on one or both sides of the recording disk substrate. The press utilizes a die for each side of the media to be imprinted. The die may include an embossing foil, or stamper, that is pressed into the embossable film of the media to form the imprinted pattern in the film. The pattern is subsequently transferred to the substrate and/or one or more layers residing above the substrate.

A press for magnetic recording disks may utilize a mandrel, or shaft, having a diameter that is sized to engage the ID of the disk. The dies have a cylindrical opening sized to receive the mandrel. The embossing foil is disposed around the mandrel and, thus, has an annular, or disk, shape with an inner diameter (i.e., a hole, or cavity, at their centers). Alignment of the embossing foil to the recording media is very important to achieve proper function in the recording media and such alignment is very challenging, particularly for double-side recording media where alignment of a mandrel holding a disk to an embossing foil on a first (bottom) die may induce alignment error relative to another embossing foil on a second (top) die. A press which maintains proper centering of a disk to both the top and bottom die as the press is operated from an open to a closed position is therefore advantageous.

Throughput of presses for magnetic recording disks may also be limited by the need to accurately imprint sub-micron (e.g., nanometer) features with high precision. For example, it is difficult to drive a press rapidly from an open state, where the dies are displaced far enough from one another that a disk may be loaded or unloaded from the press, to closed state, where nanometer features are formed (all the while maintaining the centering of the disk). A press which improves the rate at which it transitions from the open to closed state is therefore also advantageous.

A single-sided press for magnetic recording disks may also have an embossing foil affixed to a die. It can be challenging to prevent a foil-to-die coupling mechanism present on a first die of a double-sided press from adversely impacting the coupling mechanism on an opposing die as the press is closed. Furthermore, both single and double-side press systems are susceptible to the embossing foil bowing uncontrollably from center to edge (e.g., under the foil's own weight) while the press is in an open state, or buckling while the press is in a closed state (e.g., from radial expansion of the foil), either of which may produce a waviness in the imprinted features. A foil-to-die coupling mechanism which can overcome these difficulties is advantageous.

BRIEF DESCRIPTION OF THE DRAWINGS

The present invention is illustrated by way of example, and not limitation, in the figures of the accompanying drawings in which.

DETAILED DESCRIPTION

In the following description, numerous specific details are set forth, such as examples of specific, components, processes, etc., to provide a thorough understanding of various embodiments of the present invention. It will be apparent, however, to one skilled in the art that these specific details need not be employed to practice various embodiments of the present invention. In other instances, well known components or methods have not been described in detail to avoid unnecessarily obscuring various embodiments of the present invention.

The terms "over," "under," "between," and "on" as used herein refer to a relative position of one member with respect to other members. As such, for example, one member disposed over or under another member may be directly in contact with the other member or may have one or more intervening members. Moreover, one member disposed between members may be directly in contact with the two members or may have one or more intervening members. In contrast, a first member "on" a second member is in contact with that second member. Additionally, the relative position of one member with respect to other members is provided assuming operations are performed relative to a substrate without consideration of the absolute orientation of the substrate. For example, the terms "top" and "bottom" are to be understood as merely convenient labels describing only a relative physical relationship, and as such, "top" and "bottom" components may generally swap position while still achieving the same technical effect.

It should be noted that the apparatus and methods discussed herein may be used with various types of disks. In the exemplary embodiment, for example, the apparatus and methods discusses herein are used with a magnetic recording disk. Alternatively, the apparatus and methods discussed herein may be used with other types of digital recording disks, for example, a compact disk (CD), a digital versatile disk (DVD), and a magneto-optical disk.

Figure 1:
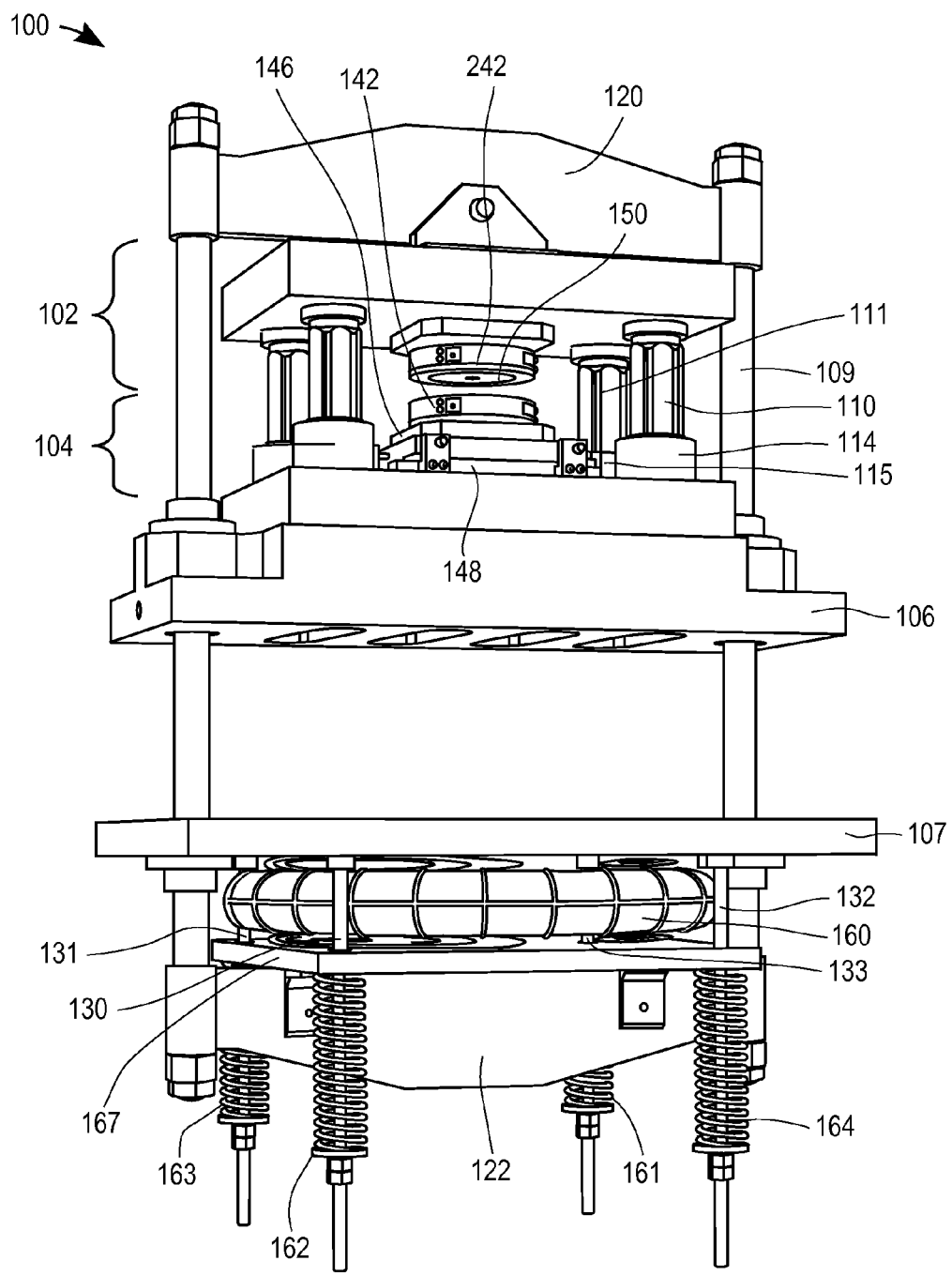
FIG. 1 illustrates a nano-imprinting press system in accordance with an embodiment.

FIG. 1 illustrates one embodiment of a press system 100 that incorporates one or more of the components as further described elsewhere herein. An upper portion of the press system 100 includes top cross beam 120, top die 102, bottom die 104, and press top base plate 106. Top die 102 and bottom die 104 are coupled by posts (e.g., posts 110, 111). The base portion of each post has a bushing (e.g., bushings 114, 115). The top die 102 also includes a top holder mount base 242 for receiving a top holder mount (not depicted in FIG. 1.) to which a top embossing foil 150 is held. The bottom die 104 includes a bottom holder mount base 142 for receiving a bottom holder mount (not depicted in FIG. 1.) to which a bottom embossing foil (not shown in FIG. 1) is held. In the depicted embodiment, the bottom holder mount base 142 is disposed above a bottom die holder base 146 and a bottom die holder base plate 148. Although not depicted, the top holder mount base 242 may be similarly assembled over a holder base plate.

A lower portion of the press system 100 includes a gas actuator 160 disposed between the first press bottom base plate 107 and the second press bottom base plate 167. The first press bottom base plate 107 may be rigidly mounted relative to the press top base plate 106 (e.g., on opposing sides of a table) so that a linear displacement of the second press bottom base plate 167 relative to the base plates 106, 107 is translated, via the main rods 109, into a linear motion of the top die 102 relative to the bottom die 104. A bottom cross beam 122 is disposed below the second press bottom base plate 167. Springs 162, 163, 161, and 164, on spring rods 130, 131, 132, and 133, compress the gas actuator 160 between the first press bottom base plate 107 and the second press bottom base plate 167. In one embodiment, during operation of the press system 100, as the gas actuator 160 expands, the second press bottom base plate 167 moves downward and away from the first press bottom base plate 107. This expansion causes the top cross beam 120 to lower and displace the top holder mount base 242 and the bottom holder mount base 142 toward each other to be in one or more closed states.

Figure 2A:
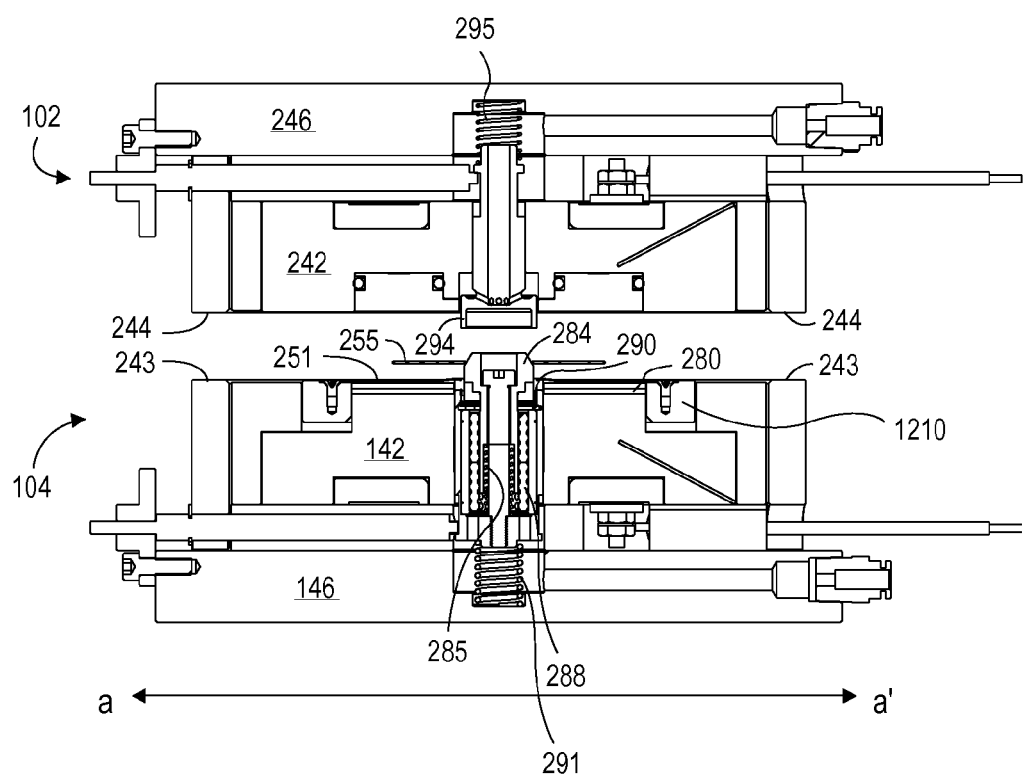
FIG. 2A illustrates a cross sectional view of a single-sided die set which may be incorporated into the nano-imprinting press system of FIG. 1, in accordance with an embodiment.

The press system 100 may be configured for either single-sided imprinting or double-side imprinting by adapting the top die 102 and/or bottom die 104. FIG. 2A illustrates an enlarged cross sectional view of one embodiment of a single-sided die set which may be incorporated into the press system 100. In FIG. 2A, the cross-sectional axis a-a' is substantially aligned with the top cross beam 120 of FIG. 1.

As shown in FIG. 2A, bottom holder mount base 142 is coupled to the bottom die holder base 146 in the bottom die 104. Similarly, a top die holder mount base 242 is coupled to the top die base plate 246 in the top die 102. A bottom embossing foil 251 is disposed above a bottom press pad 280 of the bottom die 104 and coupled by the bottom holder mount 1210 to the bottom holder mount base 142. In one embodiment, the bottom press pad 280 may include be one or more elastomeric layers that allow for a uniform press of nanoscopic imprinting features in the bottom embossing foil 251 against an embossable film of a recording media disk substrate 255. A bottom rod 284 extends through a center portion of the bottom die 104. The bottom rod 284 is sized to engage an inner diameter (ID) of the recording media disk substrate 255. A bottom ball bushing 288 surrounds the elongated portion of the bottom rod 284, and a bottom outer sleeve 290 surrounds the bottom ball bushing 288. The bottom outer sleeve 290 and the bottom rod 284 combine to form a bottom mandrel with a bottom rod spring 285 disposed between the bottom outer sleeve 290 and an end of the bottom rod 284 distal from the recording media disk substrate 255. The bottom outer sleeve 290 is, in turn, disposed on a bottom mandrel spring 291.

The bottom holder mount base 142 further includes a bottom standoff 243 which is configured to contact the top standoff 244 when the top and bottom dies 102,104 are brought into contact when the press system is in a closed state, as further described elsewhere herein. A top rod 294 extends through a center portion of the top die 102 and is coupled to the top die 102 via a top mandrel spring 295.

Figure 2B:
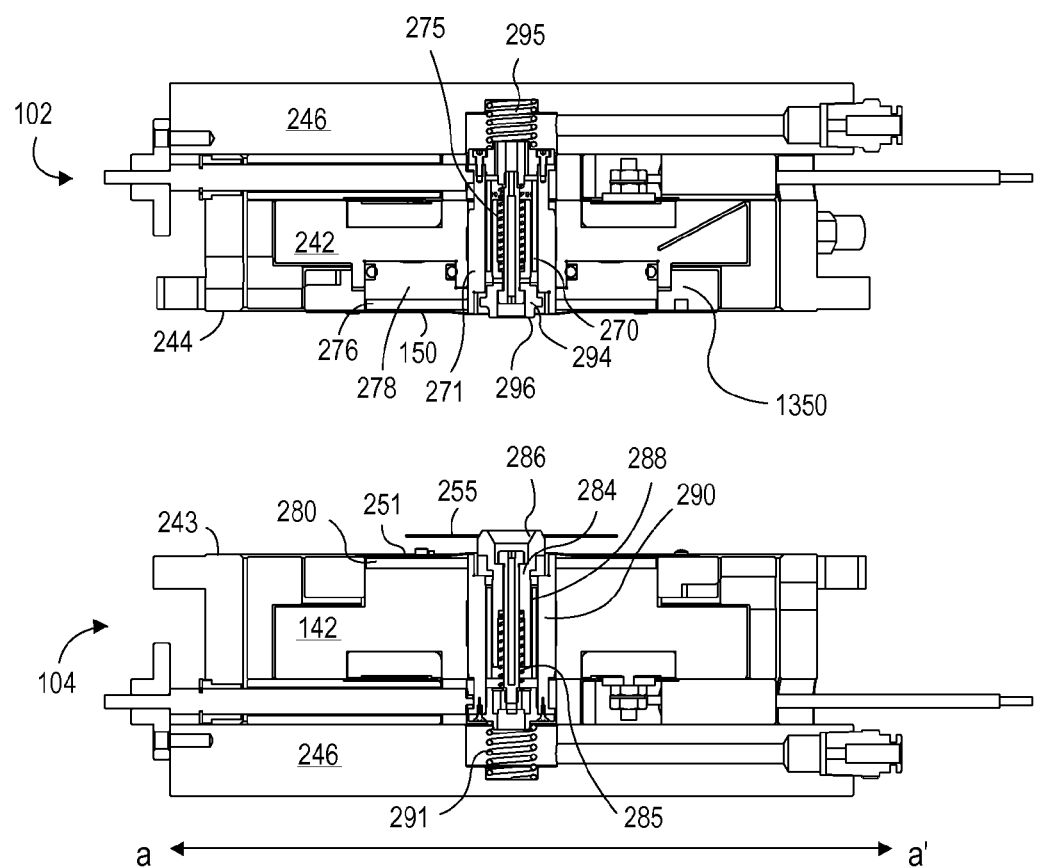
FIG. 2B illustrates a cross sectional view of a double-sided die set which may be incorporated into the nano-imprinting press system of FIG. 1, in accordance with an embodiment.

FIG. 2B illustrates a cross sectional view of one embodiment of a double-sided die set which may be incorporated into the press system of FIG. 1 for the imprinting of both sides of a recording media. In FIG. 2B, the cross-sectional axis a-a' is substantially aligned with the top cross beam 120 of FIG. 1. As depicted in FIG. 2B, the bottom die 104 includes substantially the same components as described in FIG. 2A while the top die 102 includes additional components facilitating a second side of imprinting. In the exemplary embodiment depicted, the top mandrel is separated into a top outer sleeve and a top rod 294 having a top mating surface 296. The top mating surface 296 is configured to mate with a bottom mating surface 286 of the bottom rod 284, as further described elsewhere herein. A top ball bushing 270 surrounds an elongated portion of a top rod 294 with the top outer sleeve 271 surrounding the top ball bushing 270. A top rod spring 275 is disposed between the top outer sleeve 271 and an end of the top rod 294 distal from the top mating surface 296. The top outer sleeve 271 is, in turn, disposed on the top mandrel spring 295. The top rod 294 is therefore movable relative to the top outer sleeve 271 along a longitudinal mandrel axis as a function of the top rod spring 275 while the top outer sleeve 271 is also movable relative to the top die 102 as a function of the top mandrel spring 295. A top embossing foil 150 is disposed over a top press pad 276 of the top die 102 and coupled to the top holder mount 1350 to the top holder mount base 242. In one embodiment, the press pad 276 may include be one or more elastomeric layers that allow for a uniform press of nanoscopic imprinting features in the top embossing foil 150 against an embossable film of a recording media disk substrate 255.

In one embodiment, the top and bottom ball bushings 270 and 288 hold the top/bottom rods 294, 284 in precise alignment with the top/bottom outer sleeves 271, 290, respectively, to center embossing foils 150, 251 with a longitudinal axis of the respective top/bottom rod. This allows for a concentricity to be established and maintained between the embossing foils 150,251 and the rods 294, 284. At least one of the top or bottom dies includes an opening with a larger diameter than the outer diameter of the outer sleeve to allow radial movement of a mandrel relative to the die through which the mandrel passes as the top and bottom rods are aligned to a common longitudinal mandrel axis upon closing the press. When the top rod is aligned to the bottom rod, the concentricity of the sleeves to the rods and the concentricity of the foils to the sleeves ensure that the recording media disk substrate 255 engaged by a rod is concentric with both the top and bottom embossing foils.

As depicted in FIGS. 2A and 2B, either or both of the top and bottom dies 102, 104 may further include a chamber volume which may be pressurized to displace a piston relative to the die assembly in which the piston is housed. In the exemplary double-sided die set depicted in FIG. 2B, the piston 278 is disposed within the top die 102 to provide a force against a top press pad 276 through which an imprinting force may be applied to the top embossing foil 150, as further described elsewhere herein.

FIG. 3 is a state diagram illustrating a nano-imprinting operation 300, in accordance with one exemplary embodiment. The states depicted in the nano-imprinting operation 300 are performed during one pressing cycle (i.e., from open to closed to open). FIGS. 4-9 illustrate cross sectional views of a portion of a double-sided die set in the states of FIG. 3. While FIG. 3 is described in the context of double-sided imprinting, many or all of the same states described may be performed during a single-sided imprinting operation.

Generally, in response to application of a continuous closing force, upon aligning the workpiece to one of the mandrel rods (e.g., the bottom rod 284), the nano-imprinting operation 300 maintains a positive pressure against the aligned workpiece throughout the duration of the pressing operation (e.g., throughout all closing states) to establish and preserve a centering of the workpiece relative to both the top and bottom dies 102, 104.

Figure 4:
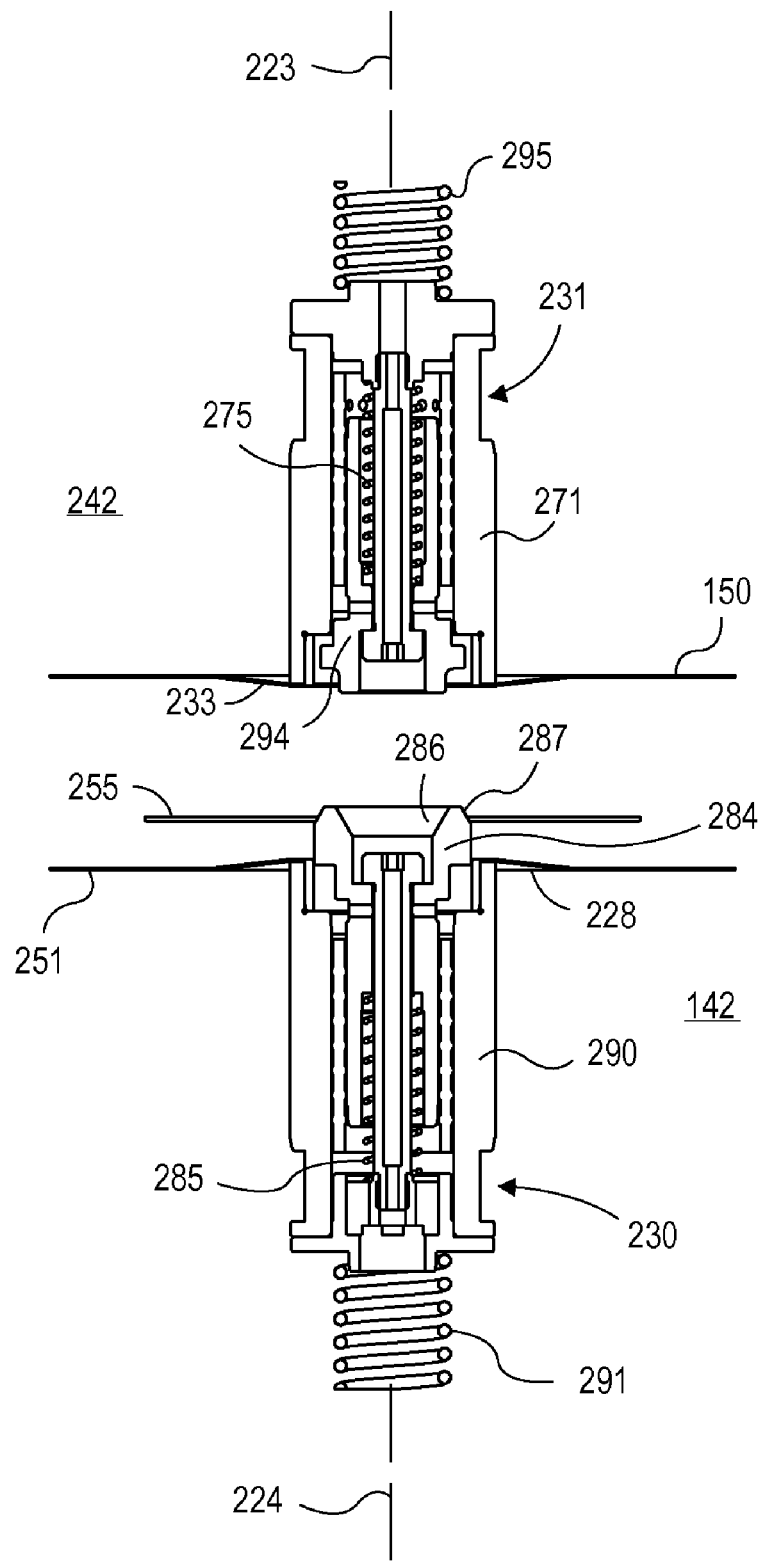
FIG. 4 illustrates a cross sectional view of a portion of a double-sided die set in an open state, in accordance with an embodiment.

The nano-imprinting operation 300 begins at the open state 301 with first receiving a workpiece into a press system. As illustrated in FIG. 4, when in an open state with the opposing dies spaced apart from one another, the bottom rod spring 285 is in a relatively decompressed state which extends the bottom rod 284 above the bottom outer sleeve 290 to receive the recording media disk substrate 255. The bottom outer sleeve 290 is similarly displaced outward relative to the bottom holder mount base 142 by the compressive force of the bottom mandrel spring 291. The bottom outer sleeve 290 includes a notch 230 which engages a cam (not depicted) to position the bottom outer sleeve 290 relative to the bottom holder mount base 142. This outward extension of the bottom outer sleeve 290 is set by the cam's position relative to the notch 230 to form a bottom doming 228 in the bottom embossing foil 251. Lifting the bottom outer sleeve 290 creates a dome-like shape (bottom doming 228) along an inner radial distance, or center, of the bottom embossing foil 251. The dome in the center portion of the bottom embossing foil 251 assists in separating the recording media disk substrate 255 from the surface of bottom embossing foil 251 when the press returns from a closed state to the open state after completing an imprinting process.

Similarly, when in an open state, the top rod spring 275 is in a relatively decompressed state. The top rod 294 is displaced beyond the top outer sleeve 271 and the top holder mount base 242, in preparation for receiving the bottom rod 284. The top outer sleeve 271 extends outward from the top holder mount base 242 in response to the compressive force of the top mandrel spring 295. The top outer sleeve 271 also includes a notch 231 which engages a cam (not depicted) to position the top outer sleeve 271 relative to the top holder mount base 242. This outward extension of the top outer sleeve 271 is set by the cam's position relative to the notch 231 to form a top doming 233 in the top embossing foil 150. In addition to defining the ready positions of the upper and lower rods and outer sleeves, the cams in the top and bottom dies 102, 104 may also set a controllable amount of spring pre-load in the mandrel springs 291, 295. Cam-notch arrangements may also be employed to set a controllable amount of spring pre-load into either or both of the top and bottom rod springs 275, 285. In one embodiment, when the press is in the open state, the four opposing springs (top and bottom rod springs 275, 285 and top and bottom mandrel springs 291, 295) are preloaded asymmetrically. As one example, the bottom rod spring 285 is preloaded to a force of 2.1 lbs, the bottom mandrel spring 291 is preloaded to 9.3 lbs, the top rod spring 275 is preloaded to 1.7 lbs, and the top mandrel spring 295 is preloaded to 12.5 lbs.

As further illustrated in FIG. 4, the recording media disk substrate 255 is disposed onto a male conical surface 287 configured to have a range of outer diameters (OD) inclusive of the inner diameter (ID) of the recording media disk substrate 255 to hold the substrate 255 (e.g., by gravity). During the open state depicted in FIG. 4, the orientation of substrate 255 may be non-orthogonal to the top mandrel longitudinal axis 223 or bottom mandrel longitudinal axis 224. For example, the recording media disk substrate 255 may be centered about the bottom mandrel longitudinal axis 224 but still have a radial axis non-orthogonal to the bottom mandrel longitudinal axis 224. Furthermore, while in the open state, the top mandrel longitudinal axis 223 may also be misaligned relative to the bottom mandrel longitudinal axis 224.

With the press system 100 loaded, a closing force is applied (e.g., via the gas actuator 160) which linearly displaces the top and bottom dies 102, 104 toward each other. The components of the press system 100 then undergo a sequence of configurations, referred to herein as "closing states" in response to the displacement of the top and bottom dies 102, 104. The physical characteristics of particular closing states are dependent upon the relative dimensions, positions and force relationships between the components of the top and bottom dies 102, 104.

Figure 5A:
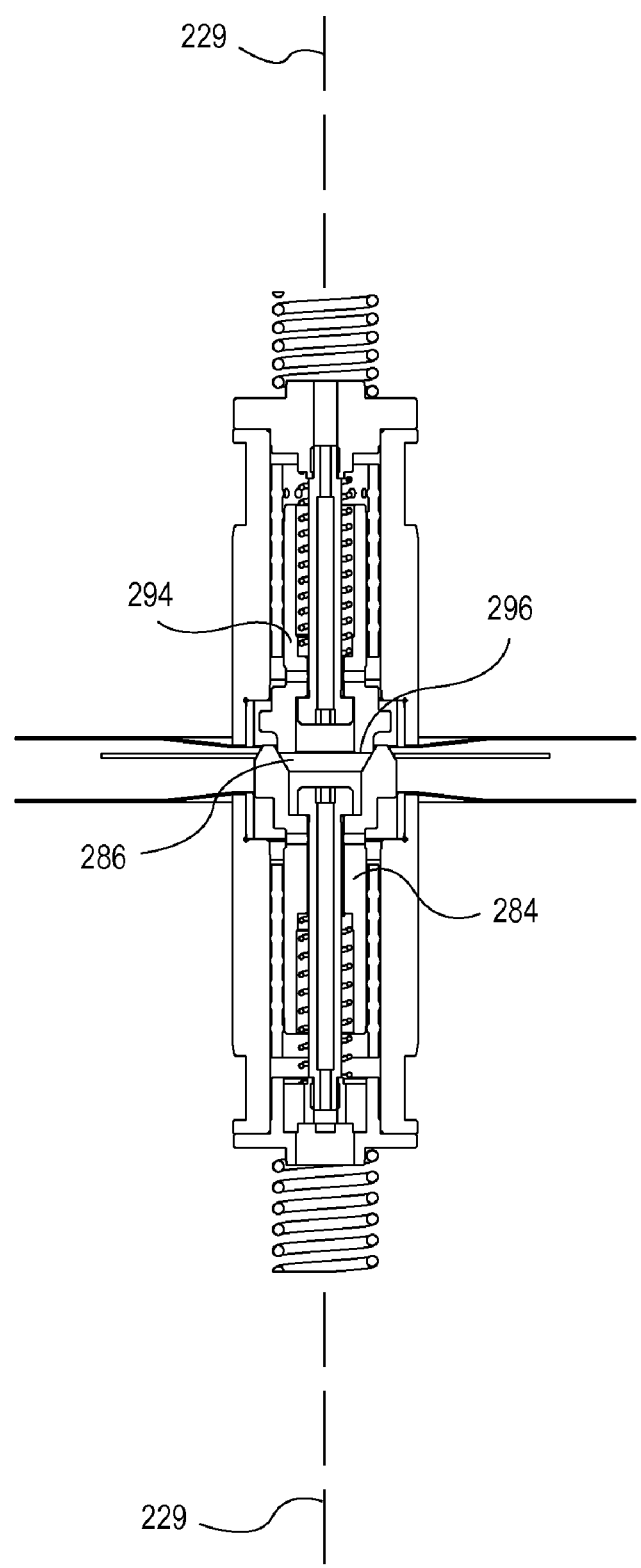
FIG. 5A illustrates a cross sectional view of a portion of a double-sided die set in a first closing state, in accordance with an embodiment.
Figure 5B:
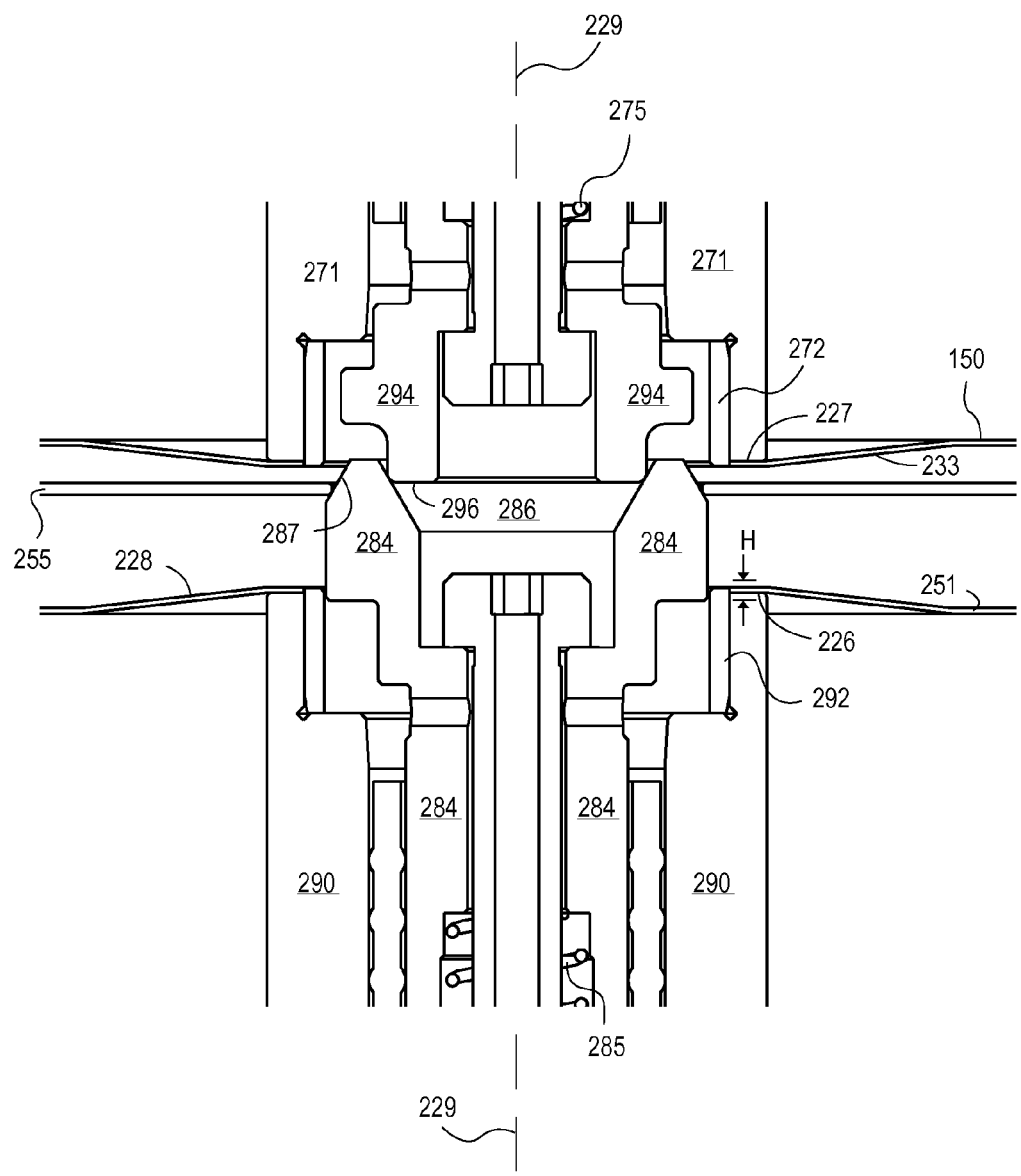
FIG. 5B illustrates an expanded cross sectional view of a portion of the double-sided die set depicted in FIG. 5A, in accordance with an embodiment.

Returning to FIG. 3, at the closing state 305, a first mandrel rod is mated with the opposing second mandrel rod and, one of the mandrel sleeves is allowed to move within a clearance in the die which aligns the longitudinal axis of each of the first and second rods along a same longitudinal mandrel axis as the press continues to close. In the embodiment depicted in FIG. 5A, as the press is closed, the top rod 294 touches the bottom rod 284 with the top mating surface 296 making contact with the bottom mating surface 286. FIG. 5B illustrates an expanded cross sectional view of a portion of a double-sided die set in the closing state 305, in accordance with an embodiment. In the exemplary embodiment, at least one of the bottom and top rods 284, 294 include a female conical or tapered end surface which couples to a male end surface of the other rod to generate a radial alignment force between the mating rod surfaces as the press continues to close and springs 275, 285, 291 and 295 apply a force along the longitudinal mandrel axis opposing the closing force. In the exemplary embodiment, the bottom mating surface 286 forms a female conical surface spanning a range of inner diameters (ID) inclusive of the outer diameter (OD) of the non-conical top mating surface 296.

Following initial contact of the opposing mandrel rods, as the dies are displaced toward one another (e.g., in direction substantially parallel to the longitudinal mandrel axis 229), the conical shape of the bottom mating surface 286 displaces either or both of the bottom and top rods 284, 294 in a radial direction (orthogonal to the longitudinal mandrel axis) within the die clearance to align the top mandrel longitudinal axis 223 with the bottom mandrel longitudinal axis 224 and form the common longitudinal mandrel axis 229. In alternative embodiments, a male conical mating surface, such as that depicted in FIG. 2A may couple to a female non-conical mating surface to align the top and bottom mandrel rods. Because the ball bushings 288 and 277 expand radially to hold a firm contact with outer sleeves 271 and 290, closing state 305 centers the alignment of the embossing foils 150, 251 about the common longitudinal mandrel axis 229.

As further shown in the expanded view of FIG. 5B, the bottom outer sleeve 290 is further coupled to a bottom shoulder ring 292. While the bottom shoulder ring 292 may be a collar machined into a portion of the bottom outer sleeve 290, in the exemplary embodiment depicted, the bottom shoulder ring 292 is a separate component such that the bottom outer sleeve 290 becomes an assembly. An outer diameter of the bottom shoulder ring 292 is substantially equal to an inner diameter of the bottom embossing foil 251. In the exemplary embodiment, the bottom embossing foil 251, annular in shape, has an inner circumferential surface directly bonded to the bottom shoulder ring 292. The bottom shoulder ring 292 centers the bottom embossing foil 251 to a longitudinal axis of the bottom outer sleeve 290 (which is aligned with the longitudinal mandrel axis 229). The bottom outer sleeve further includes a radial support surface 226 extending radially from the bottom shoulder ring 292 to an outer diameter larger than the inner diameter of the bottom embossing foil 251. The radial support surface 226 is configured to be in direct contact with a back surface of an inner radial portion of the bottom embossing foil 251. In the exemplary embodiment, radial support surface 226 is directly bonded to a portion of the back surface of the bottom embossing foil 251. As further shown in FIG. 5B, the bottom shoulder ring 292 extends along the longitudinal mandrel axis 229 beyond the radial support surface 226 by an amount, H. In the exemplary embodiment, the distance H is less than the thickness of the bottom embossing foil 251.

In FIG. 5B, the top outer sleeve 271 is coupled to a top shoulder ring 272 to form a top sleeve assembly similar to the bottom sleeve assembly. The top outer sleeve 271 centers the top embossing foil 150 to a longitudinal axis of the top outer sleeve 271 (which is aligned with the longitudinal mandrel axis 229). The top outer sleeve 271 further includes a radial support surface 227 extending radially from the top shoulder ring 272 to an outer diameter larger than the inner diameter of the top embossing foil 150. The radial support surface 227 is in direct contact with a back surface of an inner portion of the top embossing foil 150 and, in the exemplary embodiment, is directly bonded to the back surface of the top embossing foil 150. Similar to the bottom shoulder ring 292, the top shoulder ring 272 extends along the longitudinal mandrel axis 229 beyond the radial support surface 227, preferably by an amount less than a thickness of the top embossing foil 150.

For embodiments where the top or bottom shoulder ring 272, 292 forms part of a bottom sleeve assembly (e.g., as depicted in FIG. 5B), the shoulder rings 272, 292 may be of a material different than that of the radial support surfaces 226, 227. In one advantageous embodiment, the shoulder ring(s) is of a first material having a different coefficient of thermal expansion than the material of the radial support surface(s), thereby enabling the shoulder ring to be assembled into the outer sleeve(s) at a first temperature and affixed upon reaching a second temperature, different than the first temperature (e.g., press system operating temperature). As one example, the bottom shoulder ring 292 is an aluminum ring pressure fit to an inner circumference of the bottom outer sleeve 290. After the pressure fitting, the bottom shoulder ring 292 and the radial support surface may then be machined at the same time to form a contiguous machined surface. For such an exemplary embodiment, the top shoulder ring 272 may similarly form a contiguous machined surface with the radial support surface 227.

Returning to FIG. 3, with the top and bottom rods 284, 294 aligned, the nano-imprinting operation 300 proceeds to the closing state 310. As previously noted, the opposing rod springs and mandrel springs have different spring strengths which serve to asymmetrically displace the first and second mandrels from an open state to various sequential closed states in response to a closing force of the press which displaces the top and bottom dies 102, 104 toward each other. As the press continues to close, at the closing state 310, a first rod spring is compressed before a second rod spring compresses so that a first outer sleeve applies pressure to the workpiece against the rod carrying the workpiece. The shape of the first outer sleeve (e.g. height of a shoulder ring) is such that the first outer sleeve causes a domed inner portion (ID) of a first embossing foil to directly contact the workpiece and level the workpiece to be orthogonal to the common mandrel axis.

Figure 6A:
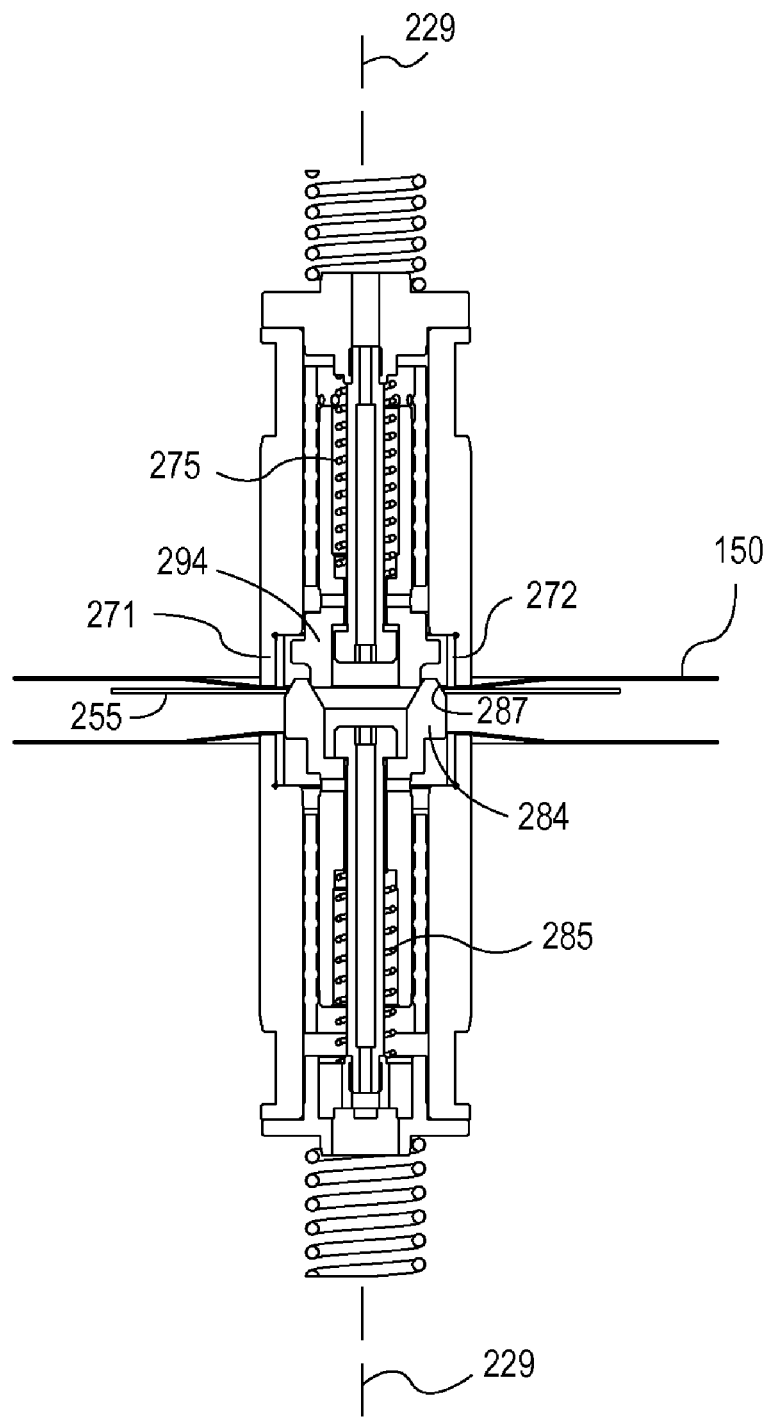
FIG. 6A illustrates a cross sectional view of a portion of a double-sided die set in a second closing state, in accordance with an embodiment.

In the exemplary embodiment depicted in FIG. 6A, the bottom rod spring 285 applies a larger spring force than the top rod spring 275 such that the top rod spring 275 compresses before the bottom rod spring 285. With the top rod spring 275 compressing at a lower press closing force than the bottom rod spring 285, the top rod 294 retracts in response to the press closing force until the top outer sleeve 271 begins to apply an opposing force against the recording media disk substrate 255.

Figure 6B:
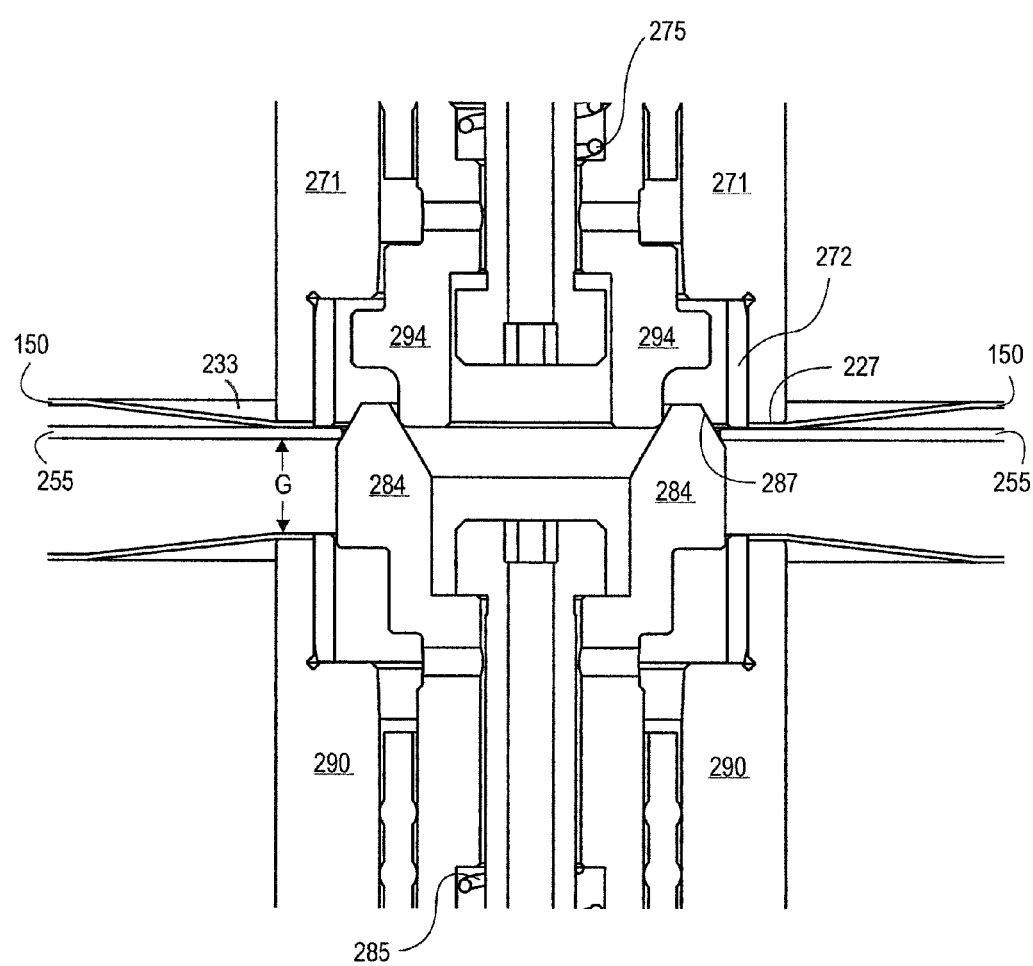
FIG. 6B illustrates an expanded cross sectional view of a portion of the double-sided die set depicted in FIG. 6A, in accordance with an embodiment.

FIG. 6B illustrates an expanded cross sectional view of a portion of a double-sided die set in the closing state 310. With the bottom rod spring 285 not yet fully compressed, a gap, G, remains between the recording media disk substrate 255 and the bottom embossing foil 251. Because the top shoulder ring 272 has a height slightly less than the thickness of the top embossing foil 150, the force provided by the top outer sleeve 271 is applied to the recording media disk substrate 255 through the portion of the top embossing foil 150 that is bonded to the upper radial support surface 227. The inner circumference of the top embossing foil 150 contacts the recording media disk substrate 255 along a radial length determined by an amount of top doming 233 present in the top embossing foil 150. The opposing force applied by the top outer sleeve 271 against the recording media disk substrate 255 serves to orient and level a radial axis of the substrate 255. In one embodiment, the opposing force applied by the top outer sleeve 271 against the recording media disk substrate 255 orients a longitudinal axis of the substrate 255 to be substantially parallel with the longitudinal mandrel axis 229.

The opposing force applied by the top outer sleeve 271 while in the closing state 310 is a function of the relative spring strengths of the top mandrel spring 295, the bottom mandrel spring 291, the top rod spring 275 and the bottom rod spring 285. While it is the relative relationship of spring strengths which enables the advantageous asymmetrical closing of the press system described herein, when the exemplary embodiment reaches the closing state 310, the top rod spring 275 provides a force of approximately 1.9 lbs, while the bottom rod spring 285 provides a force of approximately 2.1 lbs. As such, the bottom rod spring 285 remains in the preloaded state while the top rod spring 275 is in a retracted state when the magnetic recording media disk substrate 255 first contacts the top embossing foil 150.

Returning to FIG. 3, with the upper and lower mandrels and workpiece aligned to a common longitudinal mandrel axis, the nano-imprinting operation 300 proceeds to the closing state 315 in response to the press closing force. At the closing state 315, the second rod spring is compressed to displace the rod carrying the substrate relative to a second outer sleeve to eliminate the gap between the workpiece and the second outer sleeve. In one embodiment, at the closing state 315, an inner portion of the second embossing foil directly contacts the workpiece. However, in alternate embodiments, the second outer sleeve may directly contact the workpiece or apply a pressure against the workpiece through another intervening member.

Figure 7A:
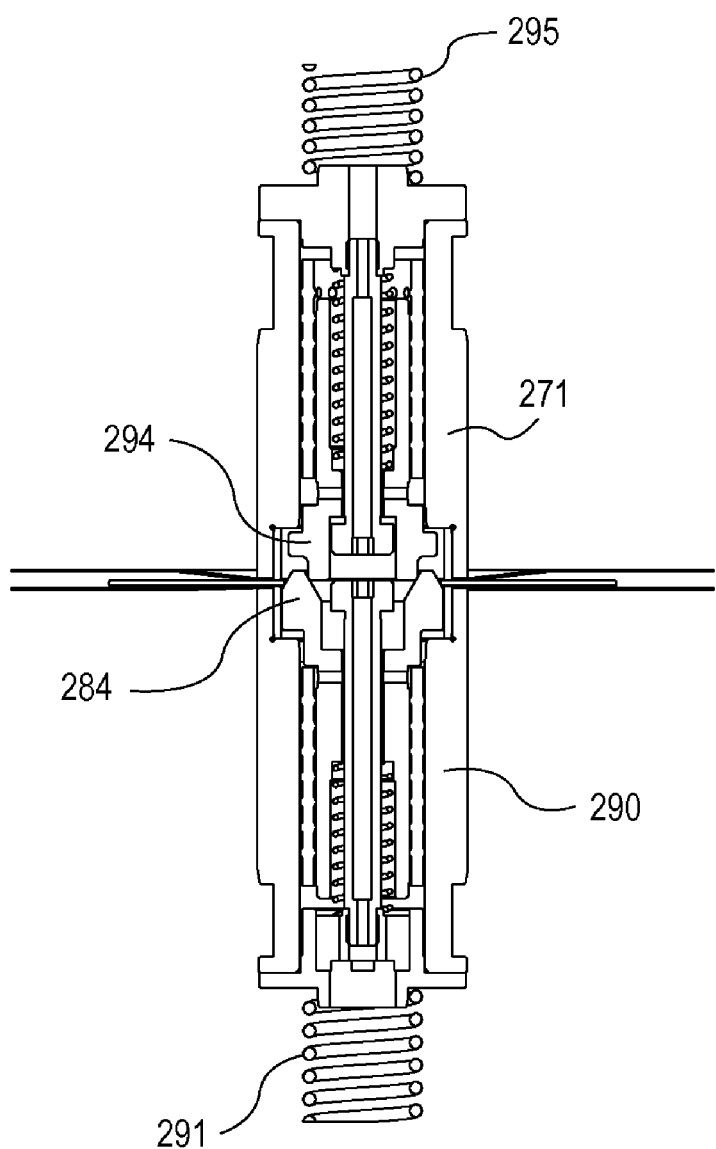
FIG. 7A illustrates a cross sectional view of a portion of a double-sided die set transitioning from the second closing state to a third closed state, in accordance with an embodiment.
Figure 7B:
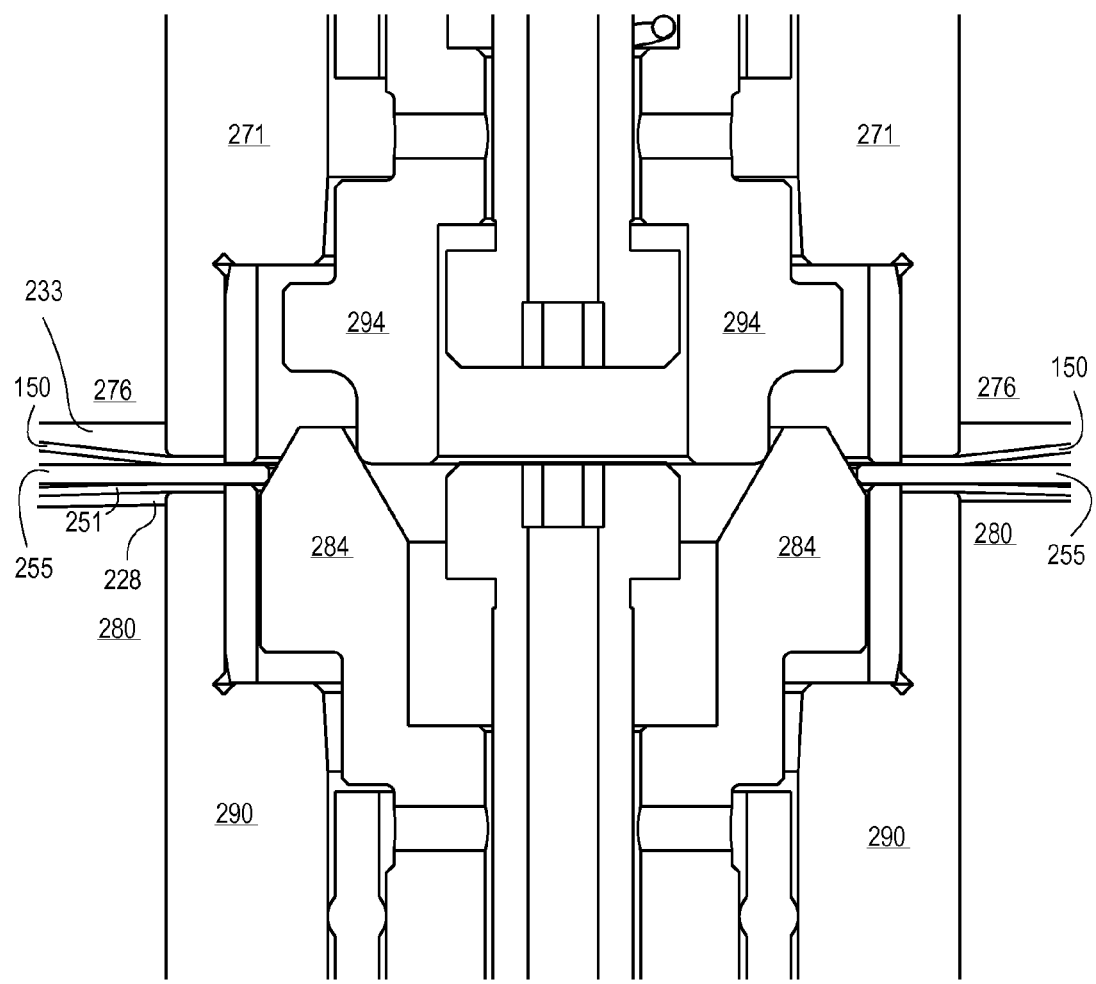
FIG. 7B illustrates an expanded cross sectional view of a portion of the double-sided die set depicted in FIG. 7A, in accordance with an embodiment.

In the exemplary embodiment depicted in FIG. 7A, the top and bottom outer sleeves 271, 290 are abutting with the top and bottom rods 284 and 294 in a fully retracted position. Upon the exemplary press system reaching the closing state 315, as illustrated in FIGS. 7A and 7B, the top rod spring 275 provides a force of approximately 1.9 lbs, while the bottom rod spring 285 provides a force of approximately 3.1 lbs. As such, the force in the bottom rod spring 285 increases from the preloaded state. As further illustrated in the expanded cross-sectional view of FIG. 7B, an inner portion of both the top embossing foil 150 and the bottom embossing foil 251 is in contact with the recording media disk substrate 255 with both the top and bottom doming 233, 228 still remaining (albeit bottom doming 228 is greatly reduced) such that the top and bottom press pads 276, 280 are not in yet in complete contact with the embossing foils 150, 251 while the press system is in the closing state 315.

Figure 8A:
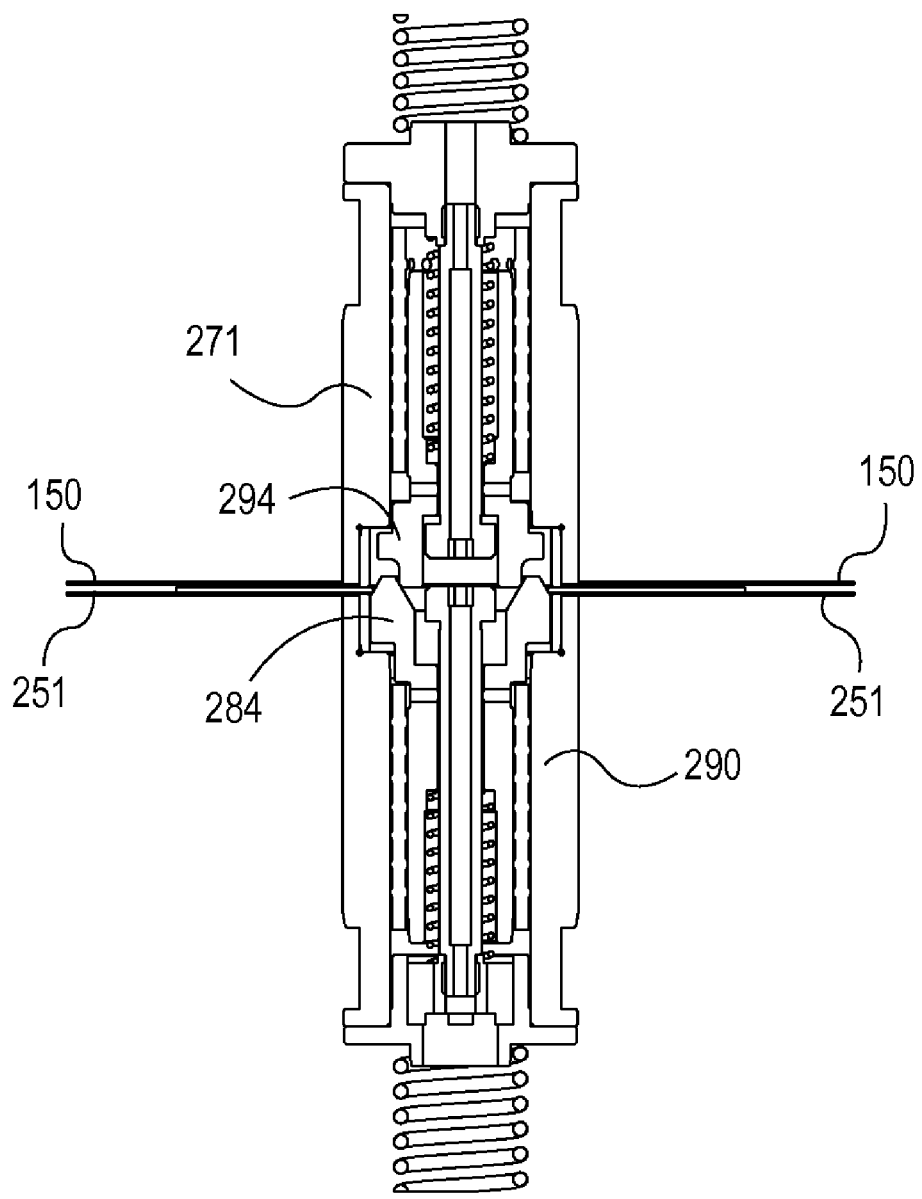
FIG. 8A illustrates a cross sectional view of a portion of a double-sided die set in a fourth closing state, in accordance with an embodiment.
Figure 8B:
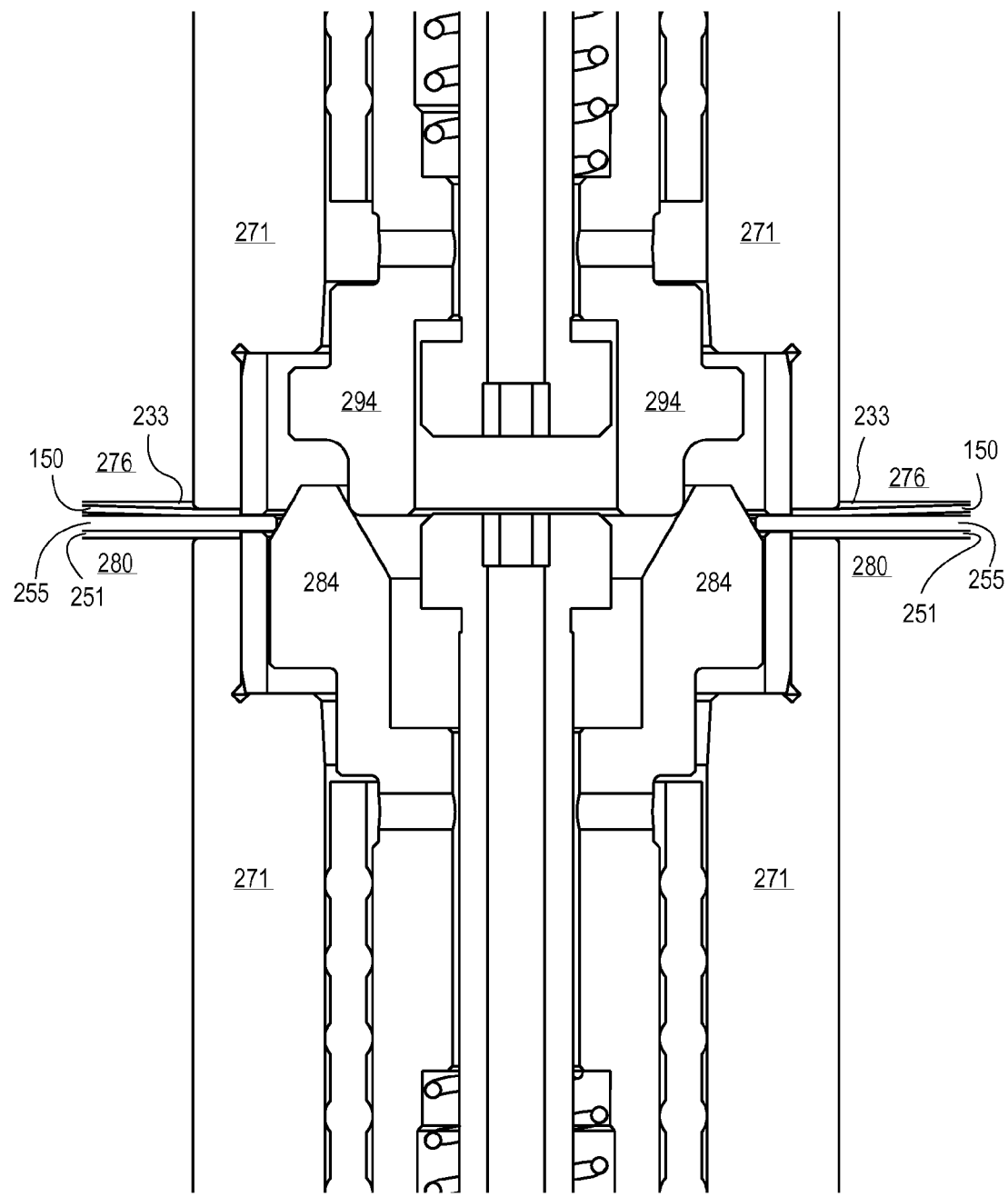
FIG. 8B illustrates an expanded cross sectional view of a portion of the double-sided die set depicted in FIG. 8A, in accordance with an embodiment.

Returning to FIG. 3, the nano-imprinting operation 300 proceeds to the closing state 320 in response to the press closing force. To reach the closing state 320, the second outer sleeve applies a force against the workpiece which opposes the force applied by the first outer sleeve and the weaker of the mandrel springs becomes the third spring to compress. A first outer sleeve is displaced until the doming in a first of the embossing foils is removed, flattening the first embossing foil coupled to the first outer sleeve. Sequentially removing the doming based on relative mandrel spring strengths may be advantageously more controllable than removing both the top and bottom doming concurrently. FIGS. 8A and 8B illustrate cross sectional views of a portion of a double-sided die set in the closing state 320, in accordance with an embodiment. The bottom doming 288 is eliminated such that the bottom embossing foil 251 is in complete contact with the bottom press pad 280 while the top doming 233 remains. Upon the exemplary press system transitioning to the closing state 320, the top rod spring 275 force remains at approximately 1.9 lbs (retracted top rod state), while the bottom rod spring 285 force remains at approximately 3.1 lbs (retracted bottom rod state). The top mandrel spring 295 force increases from the open state preload force of 12.5 lbs to approximately 13.5 lbs while the bottom mandrel spring 291 increases from the open state preload force of 9.3 lbs to a force of approximately 10.8 lbs.

Figure 9:
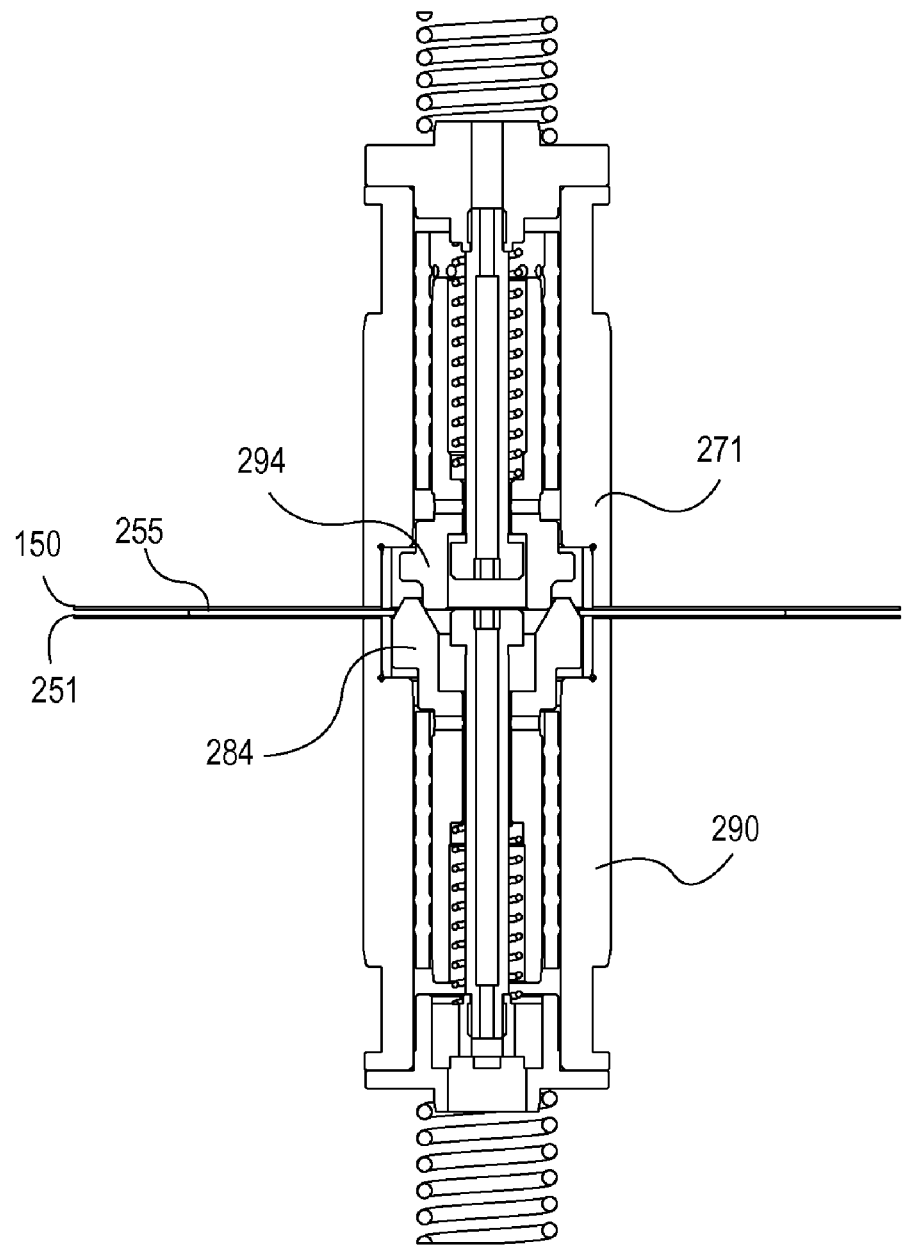
FIG. 9 illustrates a cross sectional view of a portion of a double-sided die set in a closed state, in accordance with an embodiment.

As the press continues to apply a closing force, the nano-imprinting operation 300 advances to the closed state 325 (FIG. 3) and the second mandrel spring (i.e., fourth spring) is compressed to displace the second outer sleeve relative to the second die reducing the doming at a center portion of the second embossing foil coupled to the second outer sleeve. FIG. 9 illustrates a cross sectional view of a portion of a double-sided die set in the closed state 325, in accordance with an embodiment. As shown, top doming 233 is reduced while the bottom embossing foil 251 is flat (i.e., bottom doming 288 is removed) while the top and bottom sleeves 271 and 290 are abutted against inner radius of the recording media disk substrate 255.

Depending on the configuration of the press system, imprinting may or may not occur upon advancing to the closed state 325 as a function of whether or not all of the doming in both embossing foils is eliminated upon reaching the closed state 325. For example, in one single step imprinting embodiment, imprinting of the workpiece occurs at the closing states 320 and 325 as the second embossing foil is flattened. For such embodiments, the force closing the press is the force that will imprint the workpiece and the nano-imprinting operation 300 advances along the dotted line in FIG. 3 to the open state 301. In the exemplary embodiment however, no imprinting occurs until the nano-imprinting operation 300 advances past the closed state 325 upon reaching a stopper which halts movement of the top and bottom dies 102, 104. For such embodiments, pressing is separated into two distinct phases; a "closing" phase where macroscopic displacement of the die sets occurs and a "closed" phase where microscopic displacement of the embossing foil occurs. For example, as further depicted in FIG. 3B, a two phase pressing method 340 begins at operation 341 with a magnetic recording disk received on a first die of a die set while the die set is in an open state (e.g., the open state 301). Next at operation 342, the die set is closed in the first phase where a first embossing foil is in contact with the workpiece and a second embossing foil is spaced apart from the magnetic recording disk by the doming in the second foil (e.g., the closed state 325). At operation 343, in the second phase, a piston disposed within a die is displaced while the die set is closed (e.g., the closed state 330) to reduce the doming remaining in the second embossing foil. Once the dome and associated gap is eliminated, the piston presses the embossing foil against the recording disk at operation 344.

The stopper can be set to prevent macroscopic displacement of the closing dies from imprinting the recording media disk substrate 255. The stopper defines a predetermined gap associated with the desired amount of doming to retain in the second embossing foil when the die press is closed. The stopper enables precise control in the reduction of the doming in the second embossing foil without over-compressing the workpiece (e.g., compressing the press pad 280). In such embodiments, the force imprinting the workpiece is distinct from the force closing the press. The stopper also permits the relatively large die displacement required between an open state suitable for loading and unloading a workpiece to be rapidly traversed in a first "closing" phase of the nano-imprinting operation 300. A second "closed" phase of the nano-imprinting operation 300 allows for sub-micron precision with a relatively slower traversal of a distance that is at least an order of magnitude smaller than for the closing phase. Notably, separating the nano-imprinting operation 300 into these two phases may be practiced even where the particular closing states 305-325 are not employed. For example, even for press systems which do not employ the exemplary asymmetrical arrangement of springs depicted in FIGS. 2A-9, a stopper may still be used as described herein.

Figure 10A:
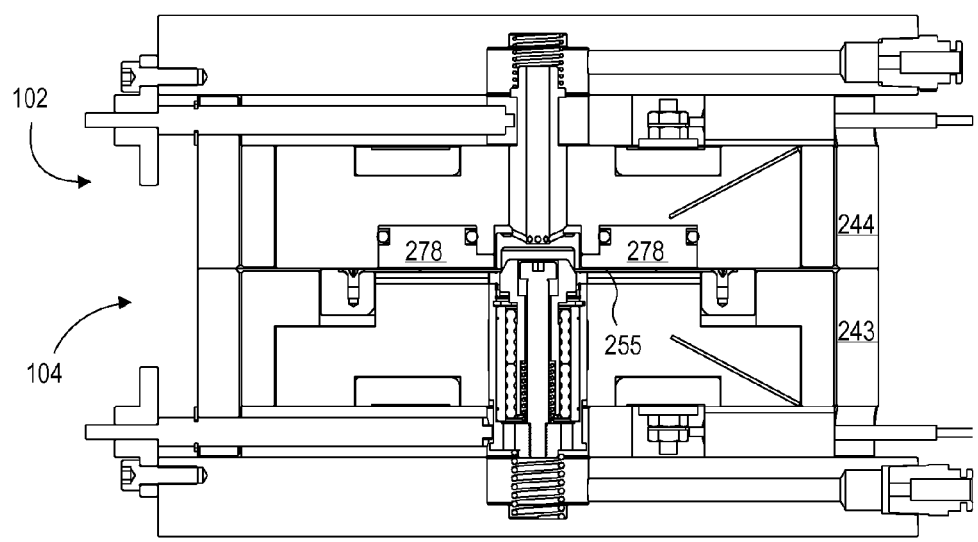
FIG. 10A illustrates a cross sectional view of a portion of a single-sided die set in closed state prior to imprinting, in accordance with an embodiment.
Figure 10B:
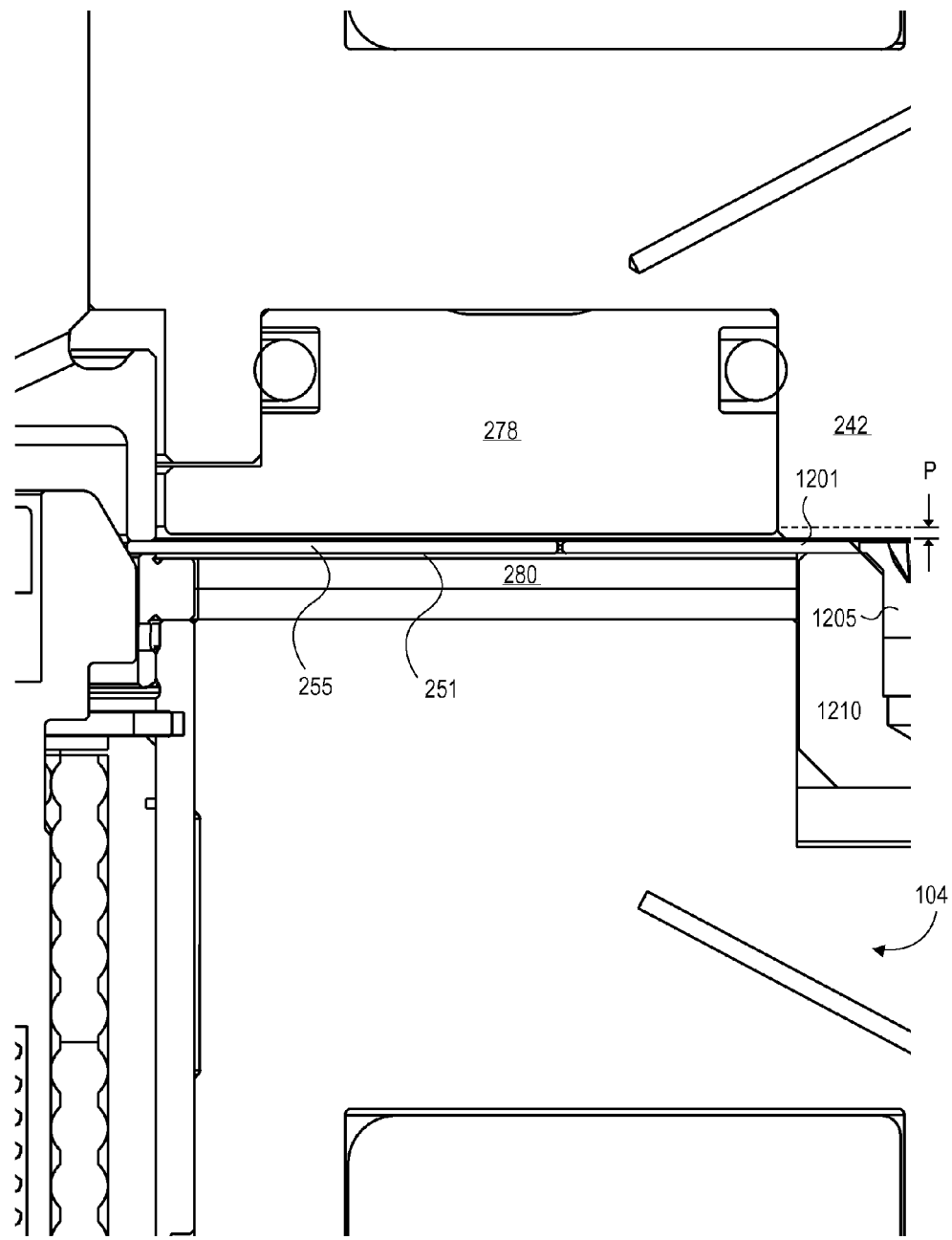
FIG. 10B illustrates an expanded cross sectional view of a portion of the single-sided die set depicted in FIG. 10A, in accordance with an embodiment.

Depending on the embodiment, the stopper may be one or more of a mechanical hard stop or a die displacement controller reactive to an optical sensor, electrical sensor, or a mechanical sensor. For a mechanical hardstop, many variations are possible. For example, opposing standoffs may be machined into the top and bottom dies 102, 104 to be in substantial alignment with each other and proximate to an outer edge of the magnetic recording disk when the die set in a closed position. FIG. 10A illustrates a cross sectional view of a portion of a single-sided die set in the closed state 325 where the bottom standoff 243 makes contact with the top standoff 244. In the depicted embodiment, the standoffs 243 and 244 make contact and serve as a mechanical stopper to halt the displacement of the top and bottom dies 102, 104 while the embossing foil 251 is still spaced apart from a magnetic recording media disk substrate 255 by a predetermined gap. FIG. 10B provides an expanded cross sectional view further illustrating that the piston 278, until subsequently actuated, is uniformly spaced apart from the recording media disk substrate 255. A non-zero gap is also present between the embossing foil 251 and the recording media disk substrate 255.

Returning to FIG. 3A, an imprinting piston is actuated to advance the nano-imprinting operation 300 from the closed state 325 to the closed state 330. As previously described either or both dies may include one or more imprinting pistons which may be moved relative to the first and second die halted by the stopper to press an embossing foil against the workpiece. The imprinting piston(s) may be activated by pressurizing a volume chamber with a gas or liquid after the die set is stopped in the closed position. Generally, the volume chamber is to be pressurized with a force less than a force holding the die set in the closed position.

Figure 11A:
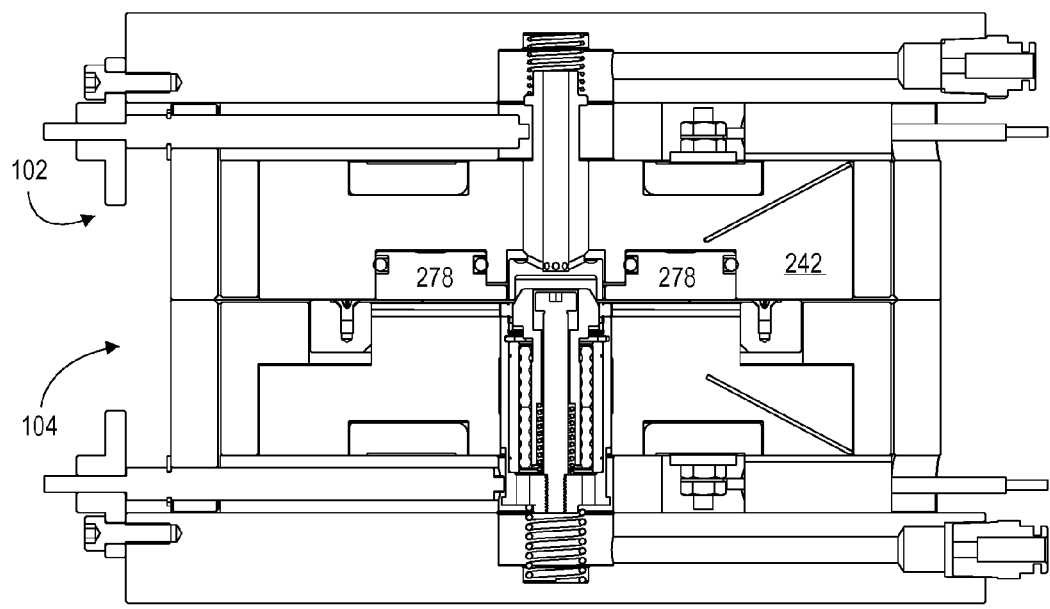
FIG. 11A illustrates a cross sectional view of a portion of a single-sided die set in the closed state while imprinting, in accordance with an embodiment.
Figure 11B:
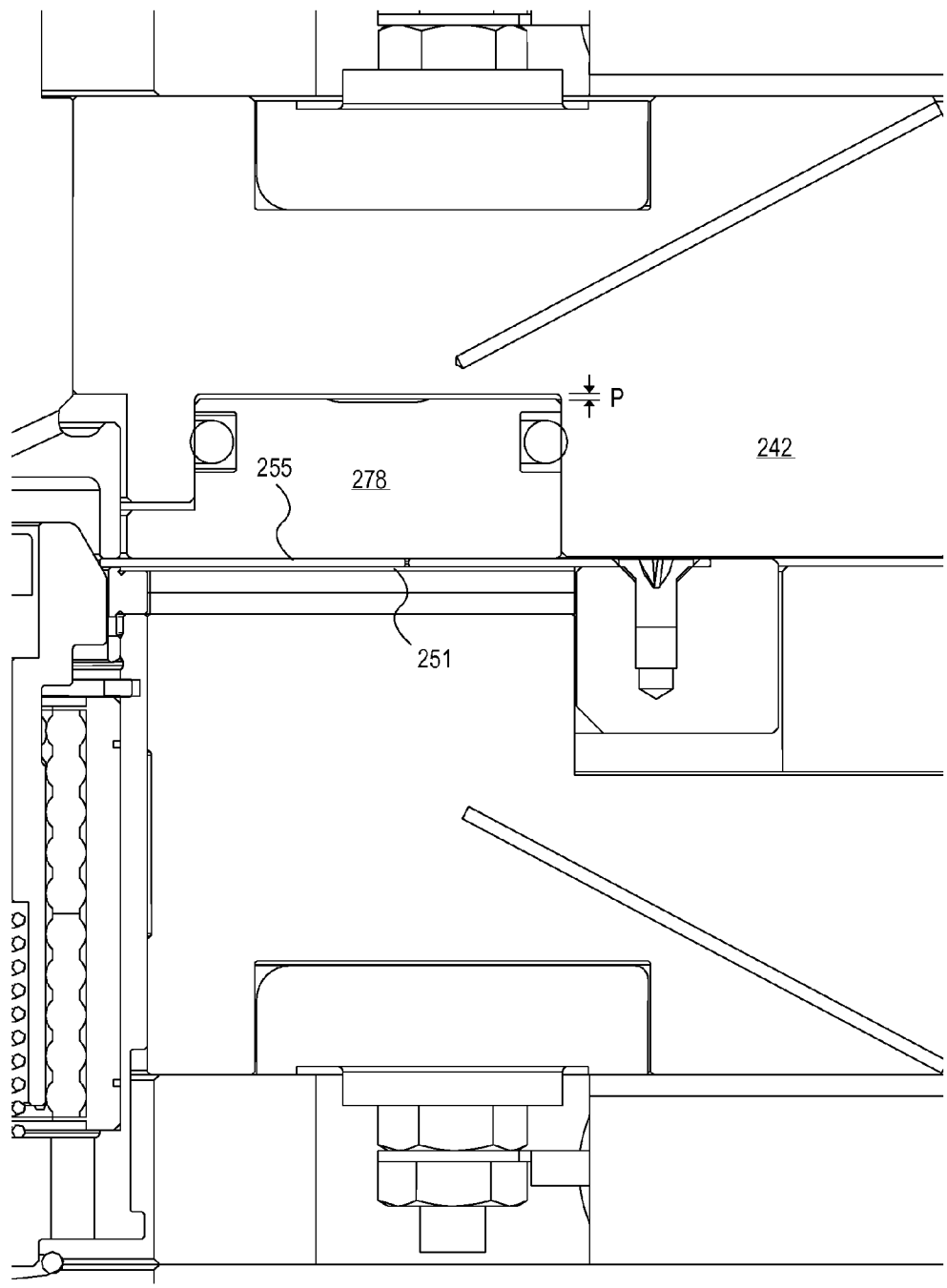
FIG. 11B illustrates an expanded cross sectional view of a portion of the single-sided die set depicted in FIG. 11A, in accordance with an embodiment.

FIG. 11A illustrates a cross sectional view of a portion of a double-sided die set in the closed state 330, in accordance with an embodiment. In the depicted embodiment, the top piston 278 in the top die 102 is moved toward the bottom die 104. FIG. 11B illustrates an expanded cross sectional view of the single-sided die set depicted in FIG. 11A. As shown, the piston 278 traverses the distance, P, to press the embossing foil 251 against the magnetic recording media disk substrate 255 to imprint features onto the substrate 255. For single piston embodiments, the distance P is at least equal to the doming which remains after the die set is closed (e.g., between approximately 0.1 mm and 0.3 mm).

In alternate embodiments, the distance, P, may vary as dependent on factors such as whether opposing pistons are employed and whether imprinting pads are employed. For example, in a particular double-side press system, an imprinting piston is disposed in both the top and bottom dies 102, 104 such that a first volume is pressurized on a side of a first piston opposite a first side of the workpiece and a second volume is pressurized on a side of a second piston opposite a second side of the workpiece to displace the first and second pistons in opposing directions toward respective embossing foils. Each of the pistons may travel a distance, P, which is at least equal to an amount of doming between the embossing foil and the workpiece which remains after the die set is closed (e.g., between approximately 0.1 mm and 0.3 mm).

After imprinting the workpiece, the nano-imprinting operation 300 advances from the closed state 330 back to the open state 301, as depicted in FIG. 3. The imprinting pistons (if employed) may be returned to the recessed home position and the closing force removed or reversed to separate the die set. In the exemplary embodiment, the states depicted in FIG. 3 are sequentially reversed as the press closing force provided by the gas actuator 160 is removed. Reversal of the states in the press operation 300 enables a controlled separation of the embossing foils from the workpiece in a manner which maintains good fidelity of the imprinted features. Return springs in addition to the mandrel and rod springs may be employed or other driving forces may be employed to advance from the closed state 330 to the open state 301. Upon opening the press system, the imprinted workpiece may be unloaded.

Figure 12A:
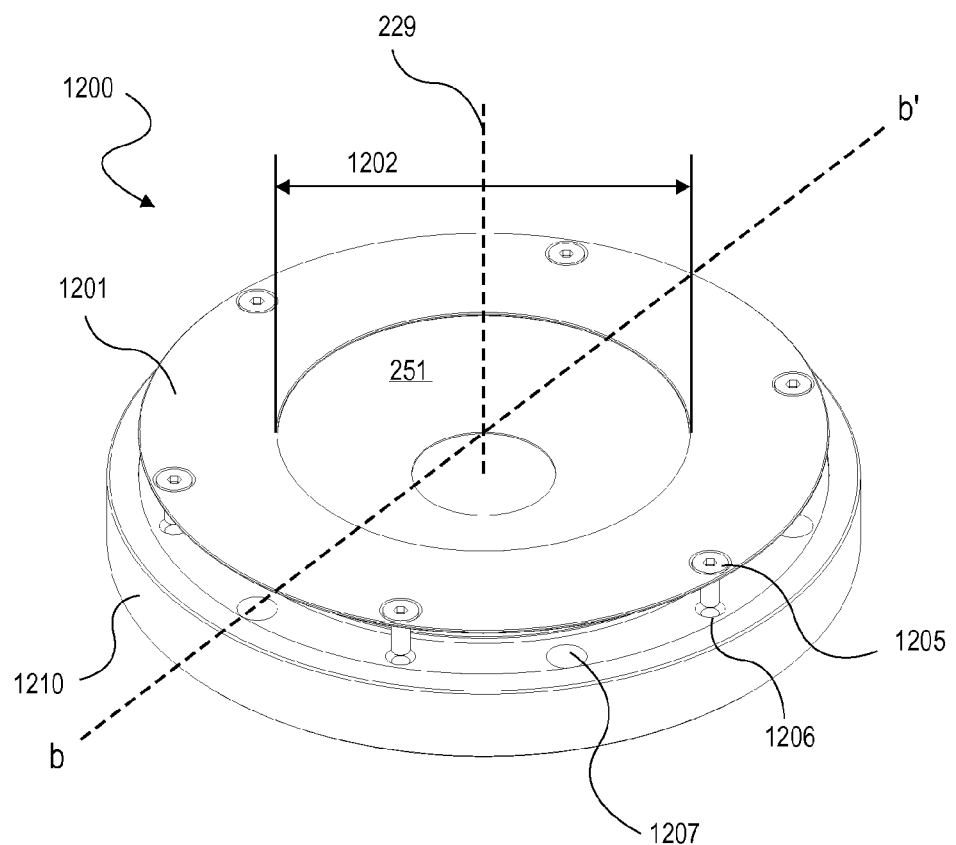
FIG. 12A illustrates an isometric view of a single-sided embossing foil holder assembly, in accordance with an embodiment.

FIG. 12A illustrates an isometric view of an assembly 1200 which includes a single-sided embossing foil holder 1201 and the holder mount 1210, in accordance with an embodiment. The assembly 1200 may be employed to affix an embossing foil to a die in a nano-imprinting press system, such as the exemplary press system 100. FIG. 10 B, for example, illustrates the assembly 1200 mounted to the bottom die 104. The holder mount 1210 is rigidly affixed to the bottom die 104, the foil holder 1201 is affixed to the holder mount 1210, and the bottom embossing foil 251 is clamped between the foil holder 1201 and a portion of the bottom die 104 (e.g., the bottom press pad 280). As shown, to allow application of pressure to the entire recording media disk substrate 255, the thickness of the foil holder 1201 should be no greater than the thickness of the recording media disk substrate 255.

As depicted in FIG. 12A, the foil holder 1201 is annular in shape to surround a longitudinal mandrel axis 229 when mounted into a press system. The foil holder 1201 has an inner diameter 1202 which is smaller than the outer diameter of the embossing foil 251 that is to be retained by the assembly 1200. The foil holder 1201 is affixed to the holder mount 1210 at a radial distance beyond an outer diameter of the embossing foil 251 such that the foil holder 1201 forms a flange overlapping an outer circumference of the bottom embossing foil 251. In the depicted embodiment, the foil holder 1201 is affixed to the holder mount 1210 with a plurality of screws 1205 which pass through openings 1206. As further illustrated in FIG. 12A, the openings 1207 may be similarly utilized to affix the holder mount 1210 to a die.

Figure 12B:
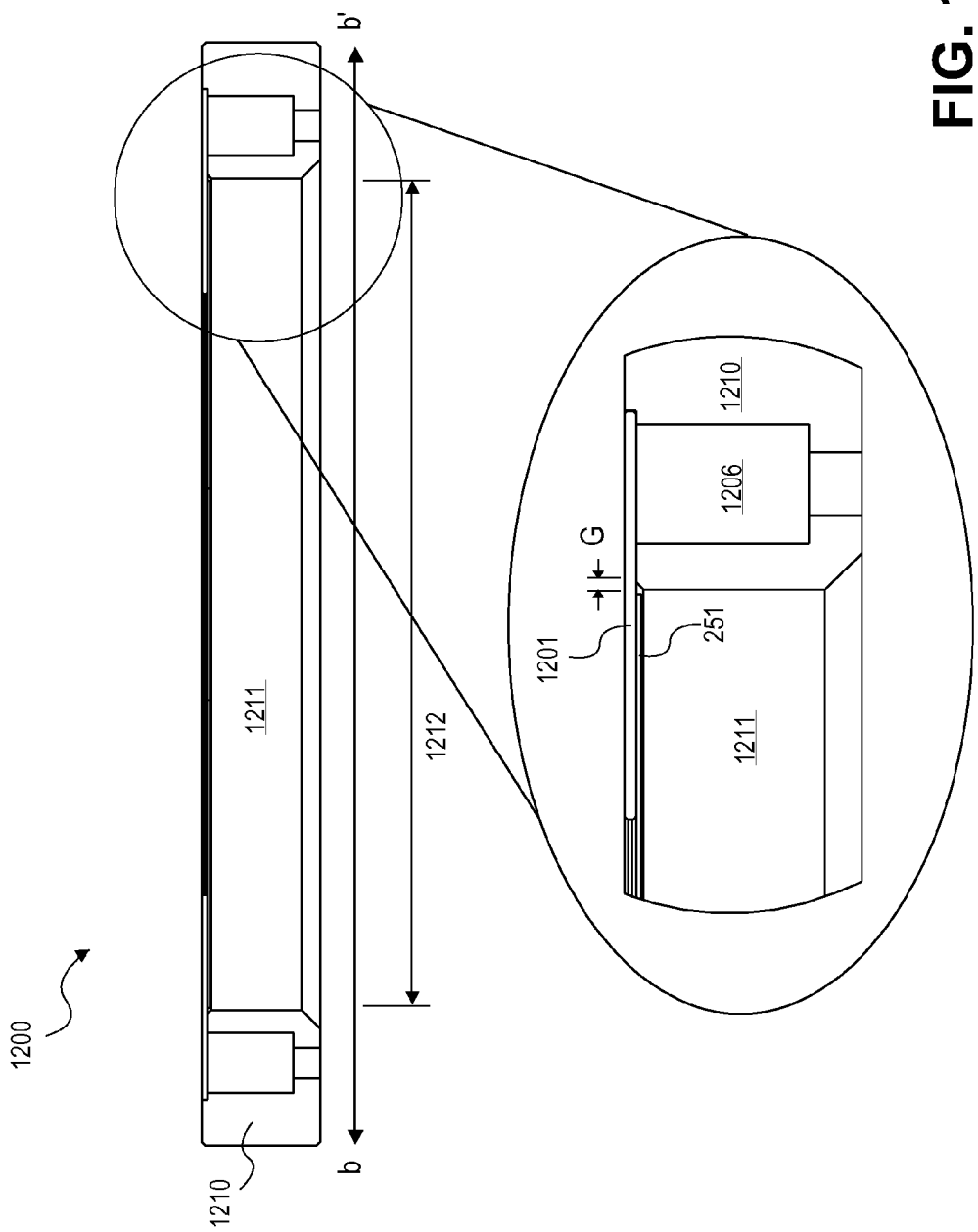
FIG. 12B illustrates cross-sectional views of the assembly in FIG. 12A, in accordance with an embodiment.

FIG. 12B illustrates views of the assembly 1200 along the b-b' cross-section. As depicted, the holder mount 1210 is annularly shaped such that the b-b' cross section forms two cross-sectional faces, one of which is illustrated in an expanded view. The holder mount 1210 has an inner circumferential surface 1211 defining an inner diameter 1212 of the holder mount 1210. In an advantageous embodiment, the inner diameter of the holder mount is larger than the outer diameter of the embossing foil 251 such that a gap, G, is formed between the outer circumference of the embossing foil 251 and the inner circumference of the holder mount 1210. In an exemplary embodiment, the gap G is approximately 0.1 mm so that, of the components in the assembly 1200, only the foil holder 1201 contacts the embossing foil 251. The foil holder 1201 presses against an outer surface of the embossing foil to apply a clamping force toward a holder mount base (e.g., disposed in the bottom die 104 as depicted in FIG. 10B).

Figure 13A:
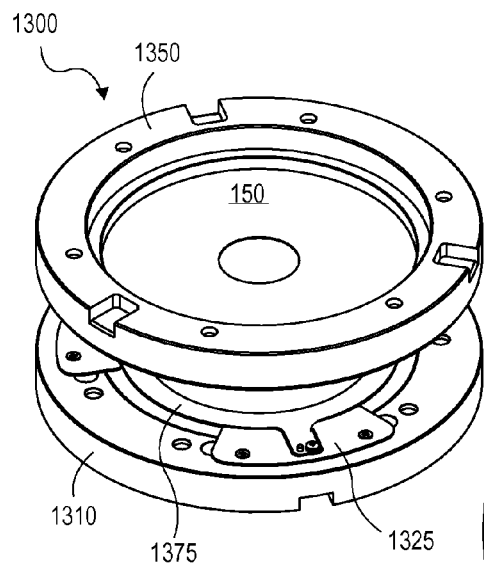
FIG. 13A illustrates an isometric view of a double-sided embossing foil holder assembly, in accordance with an embodiment.
Figure 13B:
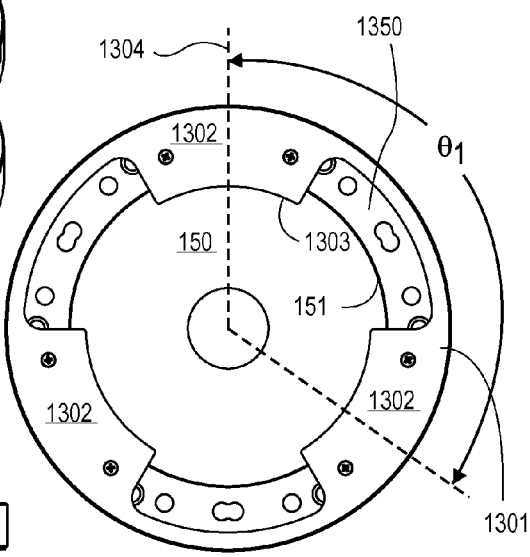
FIG. 13B illustrates a bottom-up plan view of a top side of the assembly depicted in FIG. 13A, in accordance with an embodiment.
Figure 13D:
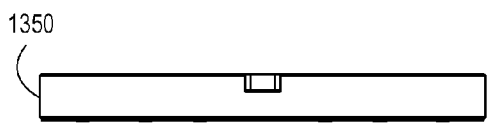
FIG. 13D illustrates a cross sectional view of the assembly depicted in FIG. 13A, in accordance with an embodiment.
Figure 13D:
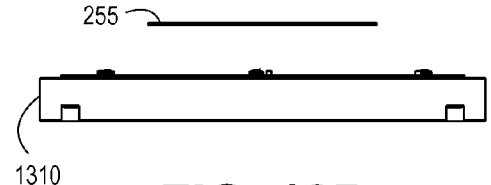
Figure 13C:
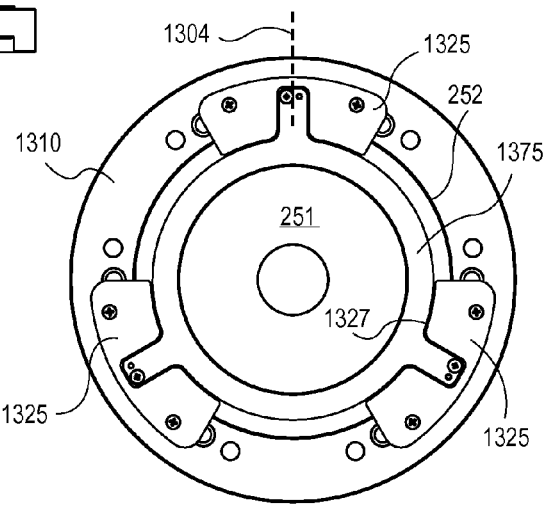
FIG. 13C illustrates a top-down plan view of a bottom side of the assembly depicted in FIG. 13A, in accordance with an embodiment.

FIG. 13A illustrates an isometric view of an assembly 1300 which includes a bottom holder mount 1310 and a top holder mount 1350 which may be employed to couple two embossing foils to a die set in a double-sided press system, such as the exemplary press system 100. FIGS. 13B and 13C illustrate plan views of the double-sided embossing foil holder of FIG. 13A. FIG. 13B illustrates a "bottom-up" plan view of an overlying top holder mount (i.e., looking up from a workpiece to be pressed) while FIG. 13C illustrates a "top-down" plan view of an underlying bottom holder mount (i.e., looking down from a workpiece to be pressed).

As illustrated in FIG. 13B, a top foil holder 1301 includes a plurality of holder tabs 1302 extending radially inward from the top holder mount 1350 to reach an inner diameter 1303 which is smaller than the outer diameter 151 of the top embossing foil 150. In other words, the holder tabs 1302 overlap a portion of the top embossing foil 150. For the depicted embodiment, the inner diameter of the top holder mount 1350 is larger than the outer diameter 151 of the top embossing foil 150 (e.g., by approximately 0.1 mm). As such, the holder tabs 1302 form first arc segments along the circumference of the top foil holder 1301 to clamp first portions of an outer circumference of the top embossing foil 150 against an underlying surface of the top die 102 when the top holder mount 1350 is affixed to a holder mount base (e.g., holder mount base 242 illustrated in FIG. 2B).

The exemplary bottom foil holder embodiment depicted in FIG. 13C includes a plurality of holder tabs 1325 extending radially inward from the bottom holder mount 1310 to reach an inner diameter 1327 which is smaller than the outer diameter 252 of the bottom embossing foil 251. In other words, the holder tabs 1325 overlap a portion of the bottom embossing foil 251. For the depicted embodiment, the inner diameter of the bottom holder mount 1310 is larger than the outer diameter 252 of the bottom embossing foil 251 (e.g., by approximately 0.1 mm). The holder tabs 1325 form second arc segments along the circumference of the bottom holder mount 1310 to clamp second portions of an outer perimeter of the bottom embossing foil 251 against a surface of the bottom die 104 when the bottom holder mount 1310 is affixed to bottom die 104.

As further illustrated in FIGS. 13B and 13C, the top foil holder 1301 has an annular shape and a radial width which varies with angular position about the longitudinal mandrel axis 229 while the bottom foil holder is comprised of the holder tabs 1325 which are physically independent of each other and each separately affixed to the bottom holder mount 1310. In an embodiment, the holder tabs 1325 are disposed the bottom holder mount 1310 at angular positions corresponding to where the first embossing foil holder, as affixed to the top holder mount 1350, has the smallest radial width. To provide approximately equal clamping force to the embossing foils, the combined arc segment length of the holder tabs 1302 is preferably approximately equal to the combined arc segment length of the holder tabs 1325. While the number of tabs for the top and bottom foil holders may vary while still achieving approximately equal arc segment lengths, the number should be sufficiently great to adequately distribute the foil clamping force along the outer circumference of the foils. In the depicted exemplary embodiment, the number of holder tabs 1302 is equal to the number of holder tabs 1325, with each of the holder tabs 1302, 1325 having a center 1304 at an angular position about the longitudinal mandrel axis 229 which is separated by an angle $\theta_1$ approximately equal to 120 degrees with the holder tabs 1302 having centers offset by approximately 60 degrees from the centers of the holder tabs 1325.

Figure 13E:
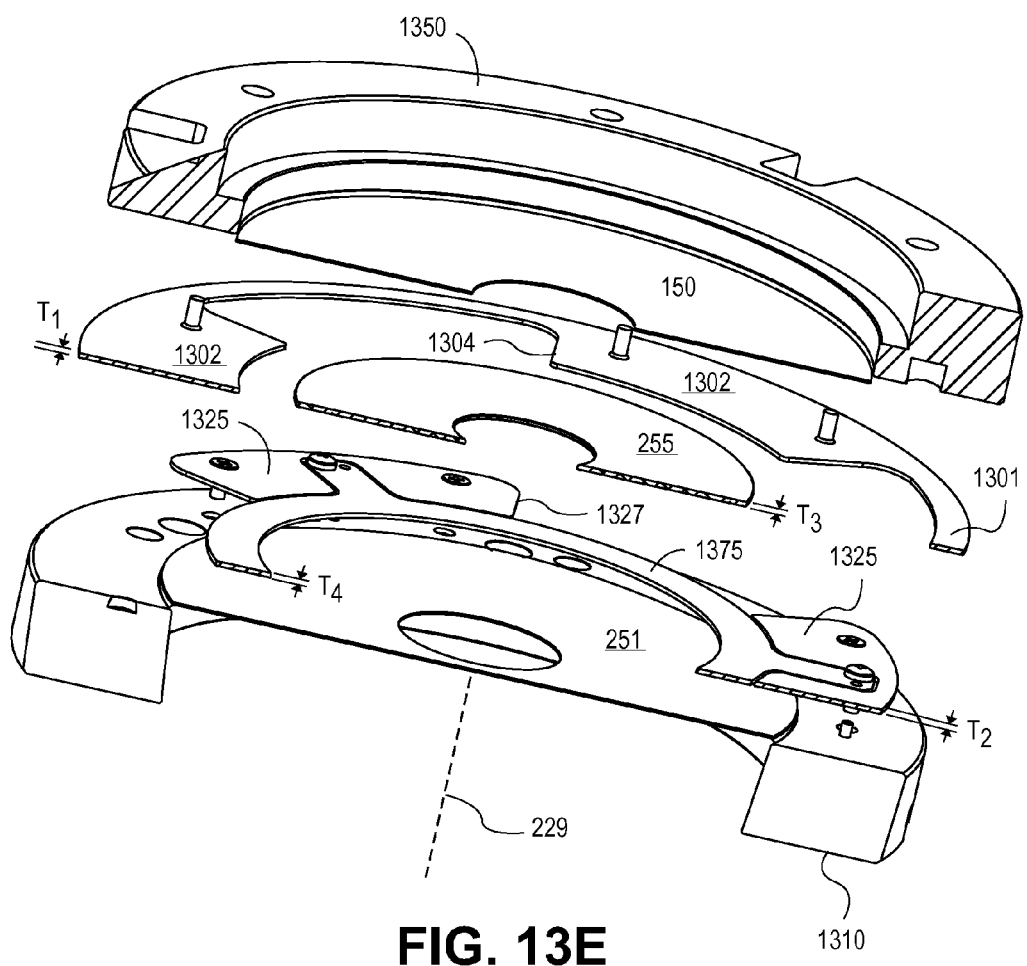
FIG. 13E illustrates an exploded isometric cross sectional view of the assembly depicted in FIG. 13A, in accordance with an embodiment.

FIG. 13E illustrates an exploded isometric cross-sectional view of the assembly depicted in FIGS. 13A, 13B and 1C, in accordance with an embodiment. As shown, a longitudinal thickness, $T_1$, of each of the plurality of holder tabs 1302 is approximately equal to the longitudinal thickness, $T_2$, of the each of the plurality of holder tabs 1325. Preferably, the longitudinal thicknesses $T_1$ and $T_2$ are less than a longitudinal thickness $T_3$ of the magnetic recording media disk substrate 255. With the thicknesses $T_1$ and $T_2$ approximately equal and less than the thickness $T_3$, when a die set closed around a magnetic recording media disk substrate 255 during a pressing operation the top and bottom foil holders interdigitate to form an annulus of an approximately constant thickness. Such an arrangement distributes pressing forces uniformly along the outer perimeters of the embossing foils without distorting the embossing foils. As shown in the cross-section depicted in FIG. 13D, the thicknesses and geometries described herein present substantially flush surfaces to the recording media disk substrate 255 for good imprinting performance.

FIGS. 13A, 13C and 13E further illustrate a support member 1375 configured to be disposed around an outer perimeter of a magnetic recording disk and between the top and bottom embossing foils 150, 251 when a die set is closed. The support member 1375 may serve as a spacer to prevent a detrimental collapse of the embossing foils adjacent to the outer perimeter of the magnetic recording disk. As illustrated in FIG. 13E, the support member 1375 is affixed to the bottom holder mount 1310 with edges adjacent to the edges of the holder tabs 1325. In one embodiment, the support member 1375 has a thickness, $T_4$, greater than the thickness $T_2$ of the holder tabs 1325.

In an alternative embodiment, the two components are unified into a monolithic piece which serves both foil holding functions and foil spacing functions.

Figure 3A:
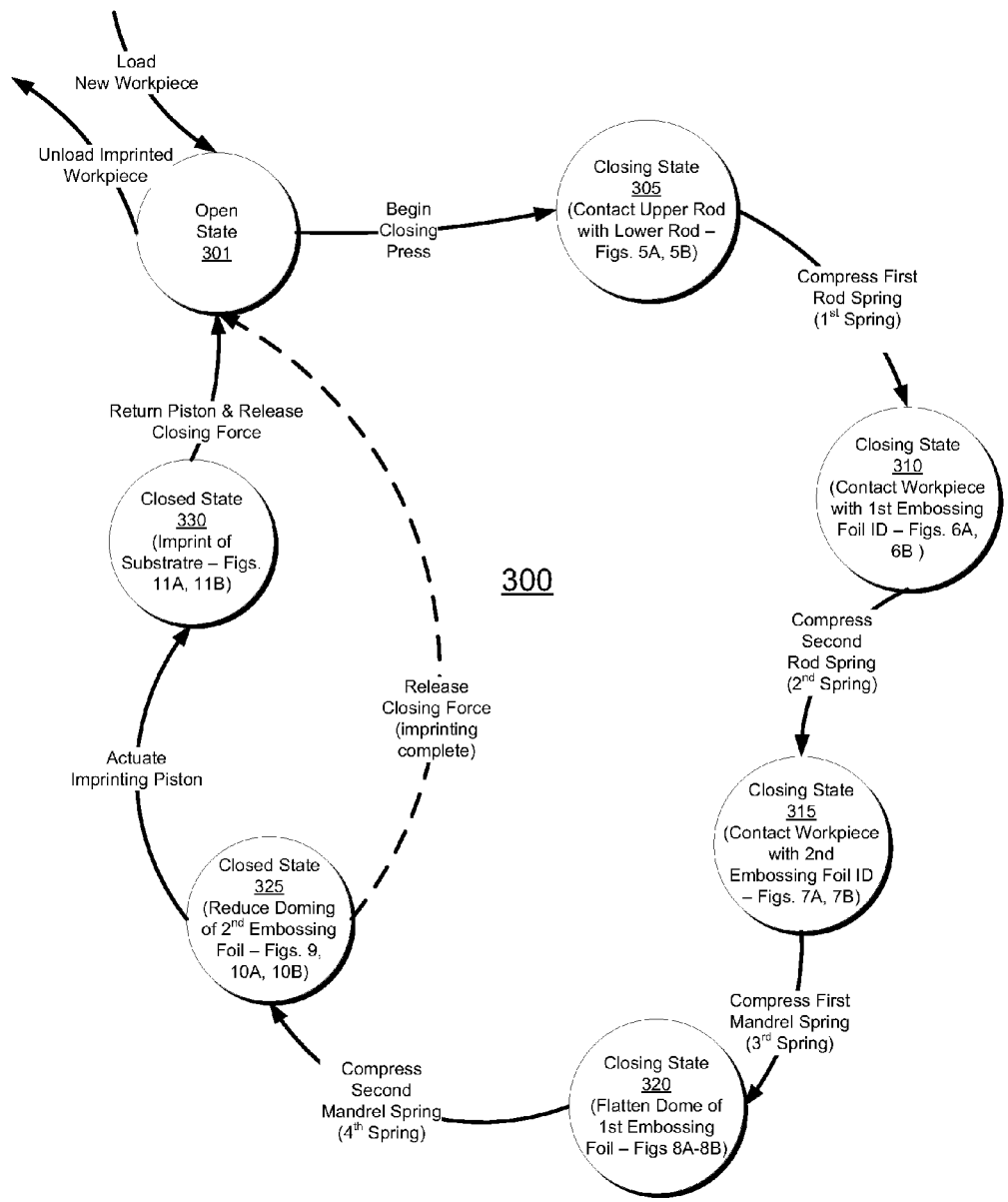
FIG. 3A is a state diagram illustrating states of an imprinting operation, in accordance with an embodiment.
Figure 3B:
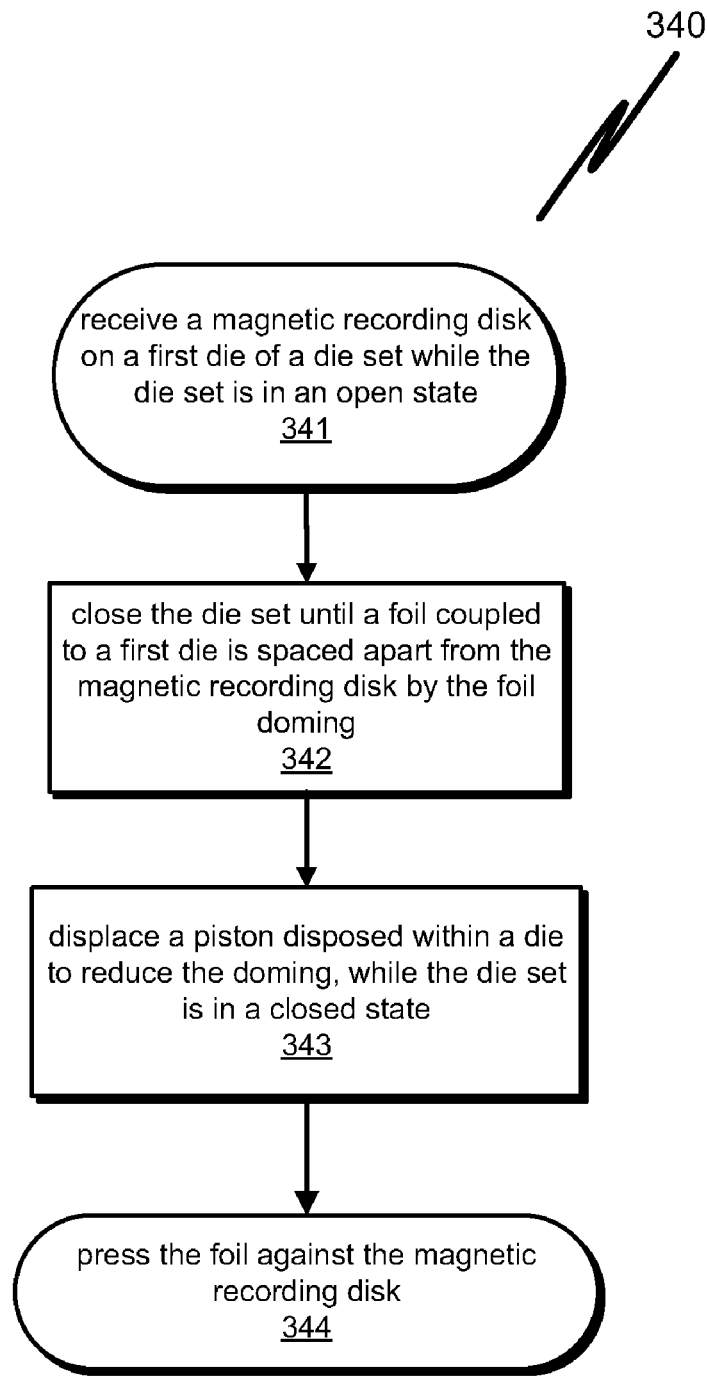
FIG. 3B is a flow diagram illustrating a two phase pressing method, in accordance with an embodiment.
Figure 3C:
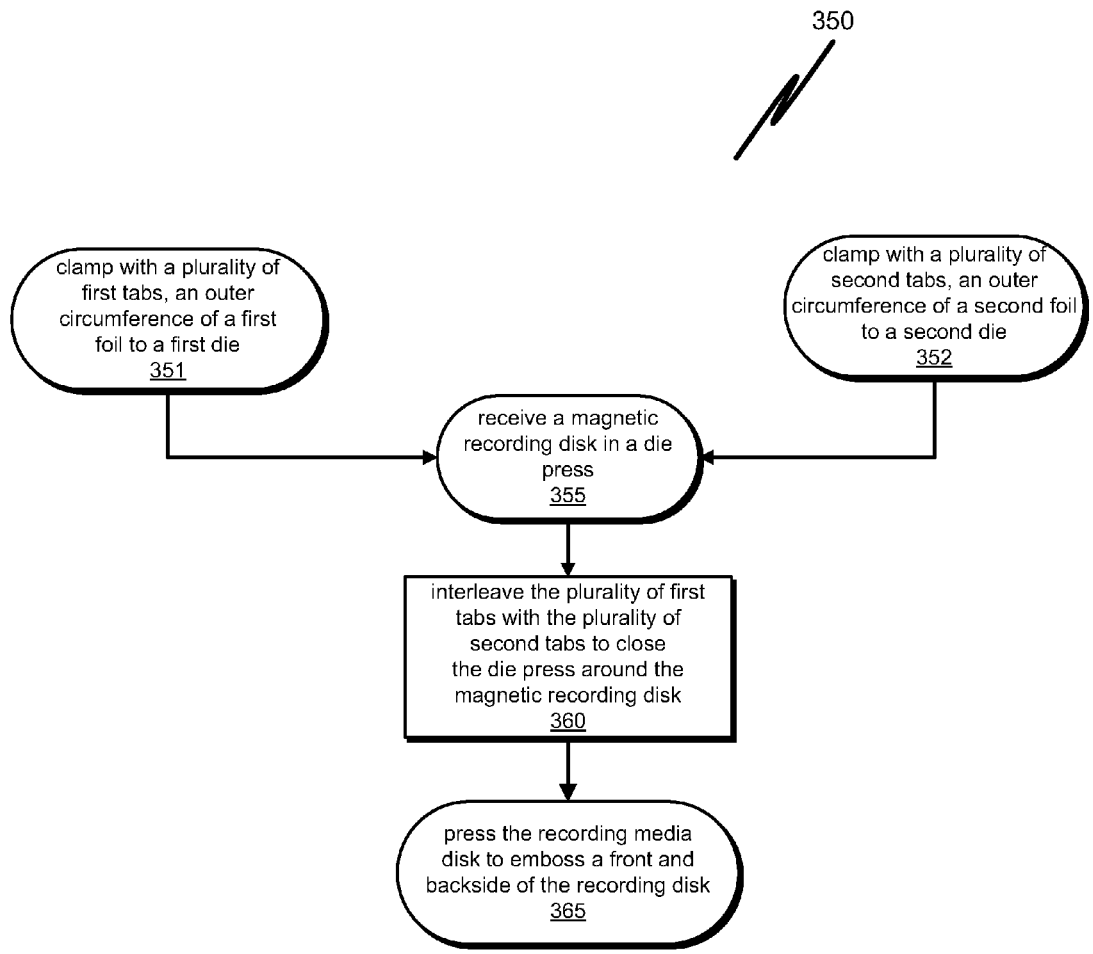
FIG. 3C is a flow diagram illustrating a double-sided pressing method, in accordance with an embodiment.

As further shown in FIG. 13E, with the holder tabs 1302 and 1325 interdigitated or interleaved, the edge 1304 is spaced apart from, but adjacent to, the edge 1327. Because the first and second arc segments formed by the holder tabs 1302 and 1325 are complementary, the holder tabs 1302 interdigitate with the holder tabs 1325 when the top and bottom dies 102, 104 are brought together (e.g., the exploded view of FIG. 13D is collapsed). While conventional double-sided imprinting processes or conventional double-sided press systems may also take benefit from the interdigitated tabbed foil holders described herein, in a particular embodiment, the assembly 1300 is affixed to the press system 100 to perform a double-sided pressing method 350, as depicted in FIG. 3C.

The method 350 begins with an outer circumference of a first embossing foil clamped to a first die with a plurality of first tabs at operation 351. For example, the top embossing foil 150 may be clamped to the top die 102 with the holder tabs 1302. At operation 352, an outer circumference of a second embossing foil is clamped to a first die with a plurality of second tabs. For example, the bottom embossing foil 251 may be clamped to the bottom die 104 with the holder tabs 1325. Next, at operation 355, a magnetic recording disk is received into the press system at operation 355 (e.g., the magnetic recording media disk substrate 255 is received into the press system 100). At operation 360, the press is closed around the magnetic recording disk by interleaving the plurality of first tabs with the plurality of second tabs. For example, as the closing state 325 (FIG. 3A) is reached, the holder tabs 1325 interdigitate with the holder tabs 1302 as depicted in FIG. 13D. At operation 365, the recording media disk is then pressed to imprint both a front side and a back side. For example, the piston 278 may be actuated during the closed state 330 as a second phase of the pressing method 350.

In particular embodiments, the embossing foil employed by a press system is coupled to a die in a manner which allows the embossing foil to expand radially during an imprinting process. Allowing such radial expansion can reduce buckling of the embossing foil and reduce waviness in the features imprinted into a recording media disk. In one embodiment, an embossing foil holder, such as any of those described in the context of assemblies 1200 and 1300, is coupled to a die which clamps a first portion of the embossing foil in a manner which still allows the clamped foil portion to move in a radial direction relative to the embossing foil holder.

Figure 14A:
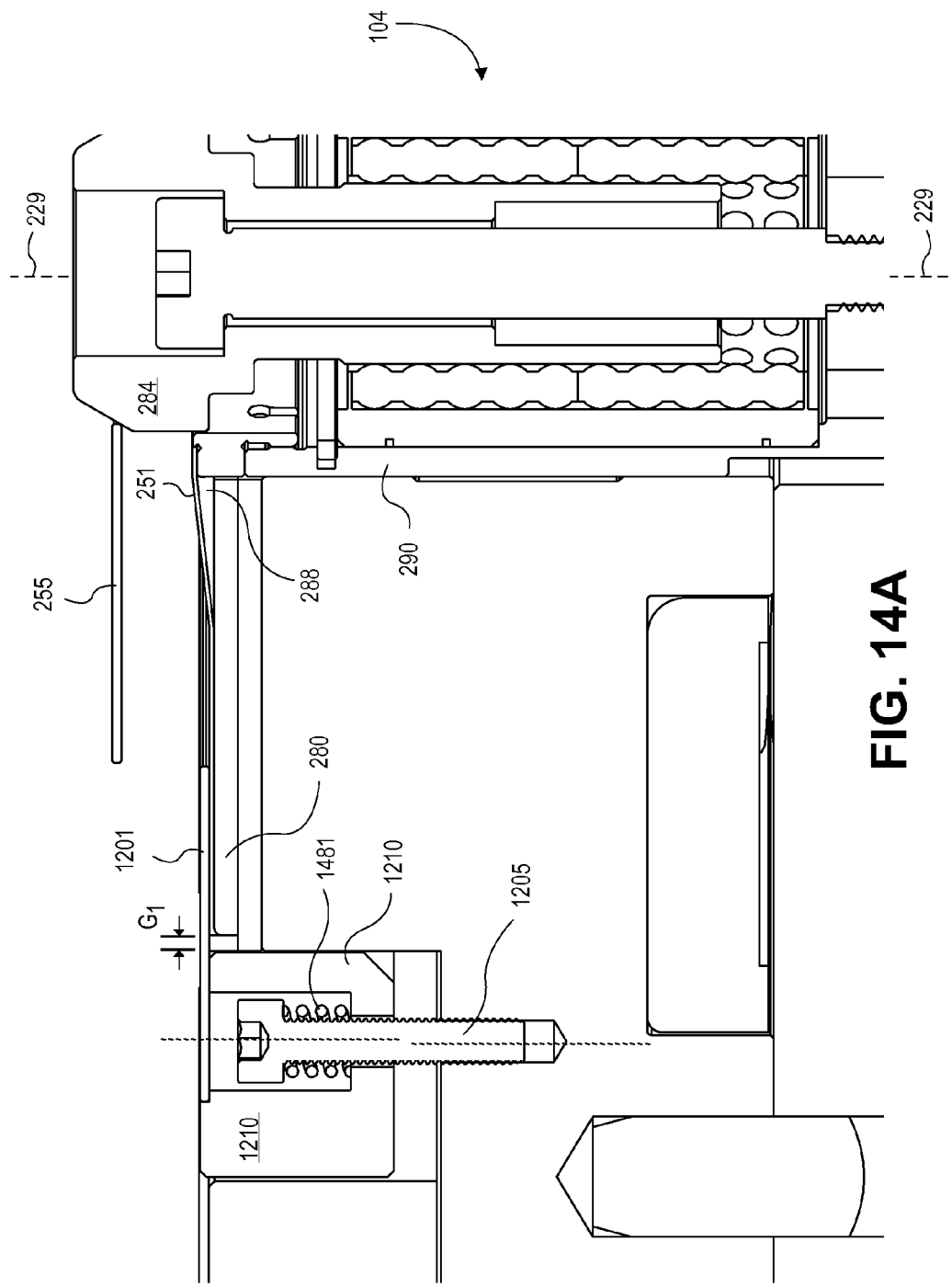
FIG. 14A illustrates a cross sectional view of a single-sided embossing foil holder mounted in a press system die, in accordance with an embodiment.

FIG. 14A illustrates a cross-sectional view of the single-sided embossing foil holder 1201 mounted in a press system die, in accordance with an embodiment. In the exemplary embodiment depicted, the press system is in an open state with the bottom rod 284 holding a recording media disk substrate 255 and the bottom outer sleeve 290 extended away from the bottom press pad 280 to form the doming 288. As described elsewhere herein, at least a portion of an inner circumference of the embossing foil is rigidly affixed and concentric to the bottom outer sleeve 290 to prohibit radial movement of the embossing foil relative to the bottom outer sleeve 290. As illustrated in FIG. 12A, the embossing foil holder 1201 is rigidly affixed to the holder mount 1210 with the holder mount 1210 sized to have an inner diameter larger than the outer diameter of the bottom embossing foil 251. The effect of such a sizing is annotated in FIG. 14A as the gap, $G_1$, between the outer edge of the bottom embossing foil 251 and the inner edge of the holder mount 1210. As shown in FIG. 14A, with the holder mount 1210 disposed within the bottom die 104, the inner surface of the holder mount 1210 becomes a sidewall of the bottom die 104 adjacent to the bottom embossing foil 251. The gap $G_1$ between the sidewall of the bottom die 104 and the bottom embossing foil 251 provides room for the bottom embossing foil 251 to move or slide radially towards the holder mount 1210. For an exemplary embodiment where the outer diameter of the bottom embossing foil 251 is at least 0.1 mm smaller than an inner diameter the holder mount 1210, the gap, $G_1$, will nominally be at least 0.05 mm and likely more as a result of the doming 288.

In one embodiment, a spring clamping assembly is employed to allow the clamped foil portion to move in a radial direction. While a variety of spring clamping assemblies are possible, in the depicted embodiment the holder mount 1210 is affixed to the bottom die 104 with a coil spring 1481. The coil spring 1481 is compressed between the screw 1205 mounted to the bottom die 104 and the holder mount 1210 (or embossing foil holder 1201 since the holder is rigidly attached to the mount 1210). The screw 1205 may be adjusted to set tensioning of the foil holder 1201 to achieve a predetermined clamping force of the bottom embossing foil 251 against the bottom die 104 (e.g., the bottom press pad 280). With the foil holder 1201 a rigid extension of the holder mount 1210, the clamping force is substantially parallel to the longitudinal mandrel axis 229. The clamping force is dependent on a number of factors, such as the friction coefficients of the embossing foil 251, the foil holder mount 1210 and the bottom press pad 280. For exemplary embodiments, the clamping force ranges between approximately 5 N and 30 N.

Each of the screws 1205 depicted in FIG. 12A may be mounted with the coil spring 1481 in the manner depicted in FIG. 14A to provide a plurality of coil springs spaced apart by an angular distance to provide the predetermined embossing foil clamping force. In an exemplary embodiment, the 6 screws 1205 depicted in FIG. 12A are each mounted with the coil spring 1481 to provide a total clamping force between 10 and 20 N.

Figure 14B:
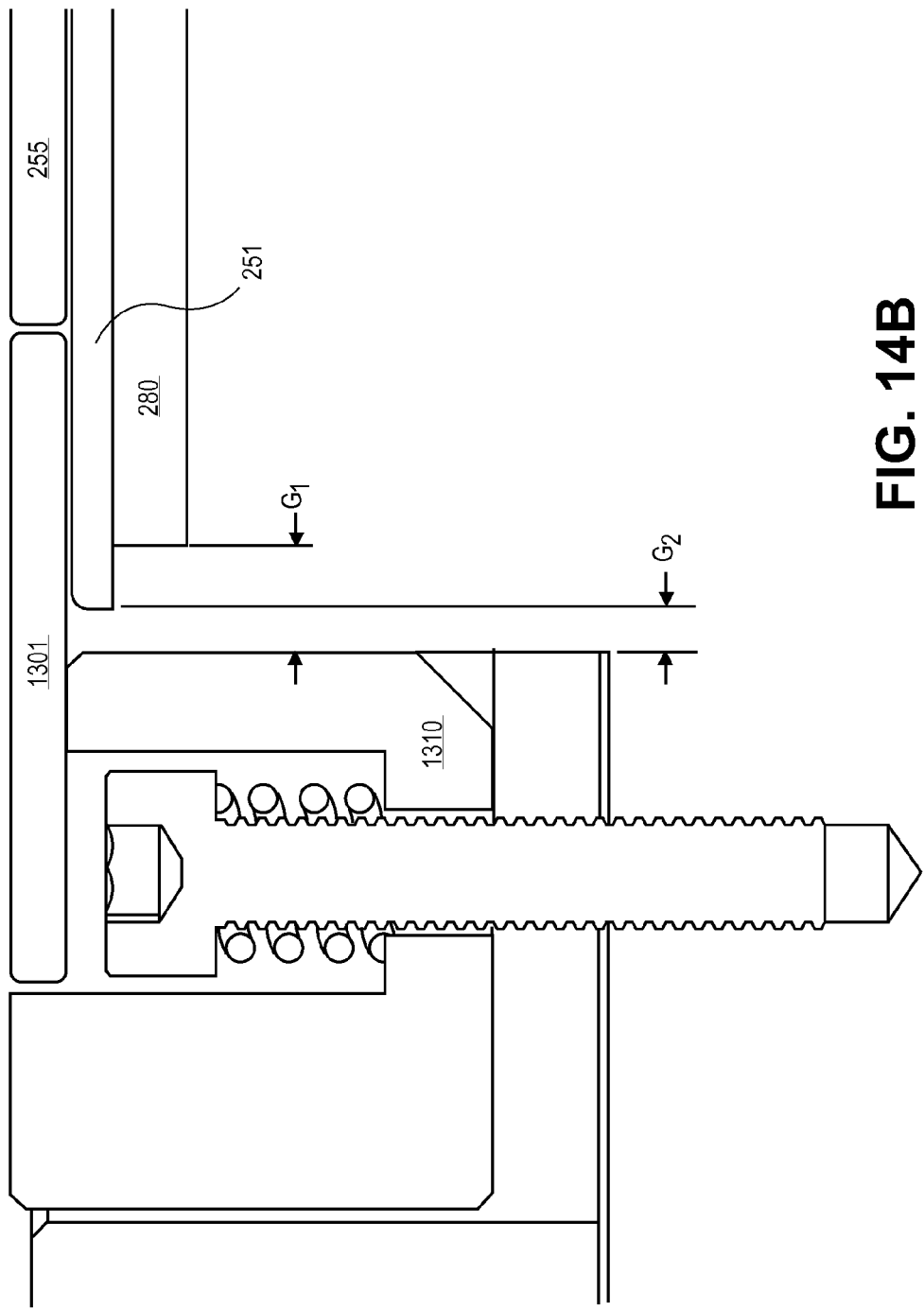
FIG. 14B illustrates a cross sectional view of the single-sided embossing foil holder of FIG. 13A when a press system is in a closed position, in accordance with an embodiment.

FIG. 14B illustrates a cross-sectional view of the single-sided embossing foil holder of FIG. 14A when a press system is in a closed position, in accordance with an embodiment. As shown, the recording media disk substrate 255 is now against the bottom embossing foil 251 and the bottom embossing foil 251 is expanded radially relative to the foil holder 1201 and the holder mount 1210 so that the gap $G_1$ is reduced to the gap $G_2$.

Double-side imprinting embodiments may also provide a clamping force which allows an outer circumference of an embossing foil to expand radially. For example, the assembly 1300, as depicted in FIGS. 13A-13E is readily adapted to allow radial foil expansion by mounting the top and bottom holder mounts with a spring tensioning assembly in a manner similar to that described for a single-sided press system. As one exemplary embodiment, each of the holder tabs 1302 may be mounted to the top holder mount 1350 with coil springs 1481 to provide a predetermined clamping force which allows the outer circumference of the top embossing foil 150 to slide against the top die 102 towards the holder tabs 1302 and top holder mount 1350. Each of the holder tabs 1325 may be mounted to the bottom holder mount 1310 with coil springs 1481 to provide a predetermined clamping force.

Figure 3D:
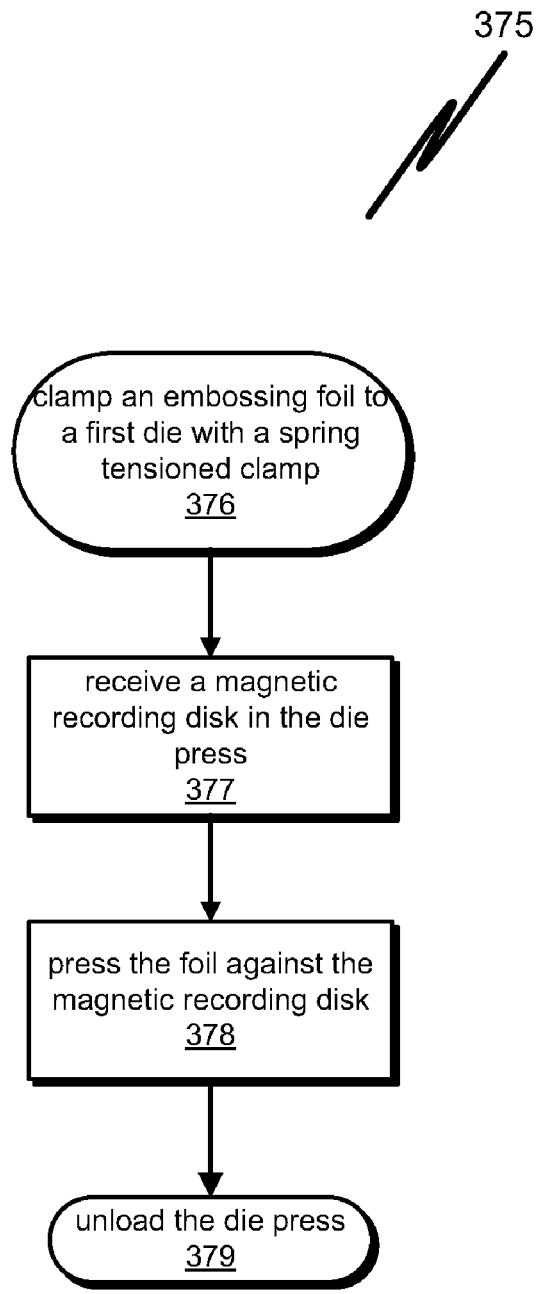
FIG. 3D is a flow diagram illustrating a pressing method, in accordance with an embodiment.

Whether employed in a double-sided configuration or a single-sided configuration, the spring tensioned foil holders described herein may be utilized to press a recording media disk. For example, FIG. 3D depicts a pressing method 375 which begins with clamping the embossing foil to a least a first die using a spring tensioned clamp (e.g., employing coil springs 1481) at operation 376. Next, at operation 377, a magnetic recording disk is received in a die press. At operation 378, the foil is pressed against the magnetic recording disk to form a discrete track recording pattern and the foil is allowed to expand by the spring tensioned clamp. The die press is then unloaded at operation 379.

The above embodiments have been described with exemplary reference to a "magnetic recording disk" substrate only for consistency of discussion. It should be noted that other types and shapes of substrates may be used (e.g., wafer and panel oxide/substrates) having an embossable material disposed thereon. The apparatus and methods discussed herein may also be used in applications such as the production of semiconductor devices and liquid crystal display panels.

In an alternative embodiment, for example, the nano-imprinting press systems and imprinting methods discussed herein may be used to fabricate pixel arrays for flat panel displays. In such a fabrication, an embossable material may be disposed above a base structure of, for example, an indium tin oxide (ITO) layer on top of a substrate. As another example, the nano-imprinting apparatus and methods discussed herein may be used to fabricate lasers. In such a fabrication, embossable material areas patterned by the embossing foils are used as a mask to define laser cavities for light emitting materials. In still other embodiments, the apparatus and methods discussed herein may be used in other applications, for example, the production of multiple layer electronic packaging, the production of optical communication devices, and contact/transfer printing.

In the foregoing specification, embodiments of the invention have been described with reference to specific exemplary features thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

What is claimed is:

1. A press system, comprising:
   a first die;
   a second die;
   a mandrel extending along a longitudinal mandrel axis through the first die, a rod portion of the mandrel to receive a magnetic recording disk to be pressed;
   a foil holder coupled to the first die, the foil holder to clamp a first portion of an embossing foil to the first die and allow the clamped foil portion to move in a radial direction relative to the foil holder; and
   a second foil holder coupled to the second die, the second foil holder to clamp a portion of a second embossing foil to the second die and to allow the clamped foil portion to move in a radial direction relative to the foil holder.

2. The press system as in claim 1, wherein the embossing foil has an annular shape, the first portion comprising at least a portion of an outer perimeter of the embossing foil.

3. The press system as in claim 2, wherein the foil holder comprises a tab contacting a surface of the embossing foil to clamp at least a portion of the outer perimeter of the embossing foil between the tab and a first surface of the first die.

4. The press system as in claim 3, wherein the first surface of the first die comprises an elastomer.

5. The press system as in claim 3, wherein at least a portion of an inner perimeter of the embossing foil is rigidly affixed to a mandrel sleeve surrounding the rod portion of the mandrel to prohibit radial movement of the embossing foil relative to the mandrel sleeve.

6. The press system as in claim 2, wherein an outer diameter of the embossing foil is at least 0.1 mm smaller than a diameter of a recess in the first die into which the embossing foil is clamped.

7. The press system as in claim 1, wherein the foil holder is affixed to the first die to provide a predetermined foil clamping force, substantially parallel to the longitudinal mandrel axis, against a first surface of the first die.

8. The press system as in claim 7, wherein the predetermined foil clamping force is between approximately 5 and 30 N.

9. The press system as in claim 7, wherein the foil holder is affixed to the first die with a coil spring compressed between a rigid body comprising the foil holder and a tensioning screw mounted to the first die.

10. The press system as in claim 9, wherein the coil spring is one of a plurality of coil springs spaced apart by an angular distance, wherein each coil spring is compressed between a rigid body comprising the foil holder and a tensioning screw mounted to the first die to provide the predetermined foil clamping force.

11. The press system as in claim 10, wherein the plurality of springs consists of 6 springs providing a total foil clamping force of between approximately 10 N and 20 N.

12. The press system as in claim 1, wherein the second foil holder comprises a tab contacting a surface of the second embossing foil to clamp at least a portion of an outer perimeter of the second foil between the tab and a surface of the second die.

13. The press system as in claim 12, wherein an outer diameter of the second embossing foil is at least 0.1 mm smaller than a diameter of a recess in the second die to provide a gap for the radial movement the clamped second foil portion.

14. A press system, comprising:
   means for clamping a portion of an embossing foil to a first die of a die press with a spring tensioned clamp;
   means for receiving a recording media disk in the die press; and
   means for pressing the embossing foil against the recording media disk to emboss a side of the recording media disk with a discrete track recording pattern.

15. The press system as in claim 14, wherein the embossing foil has an annular shape, the clamped portion of the foil comprises at least a portion of the outer perimeter of the embossing foil, and wherein the rigidly affixed portion of the foil comprises at least a portion of the inner perimeter of the embossing foil.

* * * * *